(12) United States Patent
Min et al.

(10) Patent No.: US 12,022,614 B2
(45) Date of Patent: Jun. 25, 2024

(54) INTERPOSER AND ELECTRONIC DEVICE INCLUDING THE SAME

(71) Applicant: Samsung Electronics Co., Ltd., Suwon-si (KR)

(72) Inventors: Bongkyu Min, Suwon-si (KR); Taewoo Kim, Suwon-si (KR); Jinyong Park, Suwon-si (KR); Hyelim Yun, Suwon-si (KR); Hyeongju Lee, Suwon-si (KR); Sanghoon Park, Suwon-si (KR); Jiseon Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 479 days.

(21) Appl. No.: 17/487,673

(22) Filed: Sep. 28, 2021

(65) Prior Publication Data

US 2022/0104356 A1    Mar. 31, 2022

Related U.S. Application Data

(63) Continuation of application No. PCT/KR2021/013135, filed on Sep. 27, 2021.

(30) Foreign Application Priority Data

Sep. 28, 2020  (KR) ........................ 10-2020-0125622

(51) Int. Cl.
*H05K 1/00* (2006.01)
*H01L 23/528* (2006.01)
(Continued)

(52) U.S. Cl.
CPC ........... *H05K 1/141* (2013.01); *H01L 23/528* (2013.01); *H04M 1/0277* (2013.01);
(Continued)

(58) Field of Classification Search
CPC ........ H05K 1/141; H05K 1/111; H05K 1/115; H05K 1/144; H05K 2201/10378; H01L 23/528; H04M 1/0277
See application file for complete search history.

(56) References Cited

U.S. PATENT DOCUMENTS 8,786,098 B2   7/2014  Wang
2003/0156396 A1*  8/2003  Pearson ............... H05K 3/3436
                                                        361/767
(Continued)

FOREIGN PATENT DOCUMENTS

KR   10-2009-0024406 A   3/2009
KR   10-2009-0039341 A   4/2009
(Continued)

OTHER PUBLICATIONS

International Search Report and Written Opinion dated Jan. 3, 2022, issued in International Patent Application No. PCT/KR2021/013135.

*Primary Examiner* — Pete T Lee
(74) *Attorney, Agent, or Firm* — Jefferson IP Law, LLP

(57) ABSTRACT

The disclosure relates to an electronic device including an interposer. The interposer includes a substrate and a plurality of connecting structures disposed on the substrate and electrically connecting a first circuit board and a second circuit board disposed in the electronic device. The plurality of connecting structures includes a plurality of via holes formed in the substrate, a plurality of conductive members disposed in the plurality of via holes, an insulating member disposed between the plurality of conductive members, and a plurality of pads disposed on the outer periphery of the plurality of conductive members. The plurality of conductive members may be separately disposed on the substrate to electrically connect with the first and second circuit boards.

18 Claims, 15 Drawing Sheets

(51) Int. Cl.
*H04M 1/02* (2006.01)
*H05K 1/11* (2006.01)
*H05K 1/14* (2006.01)

(52) U.S. Cl.
CPC .............. *H05K 1/111* (2013.01); *H05K 1/115* (2013.01); *H05K 1/144* (2013.01); *H05K 2201/10378* (2013.01)

(56) References Cited

U.S. PATENT DOCUMENTS

| 2008/0176417 | A1 | 7/2008 | Hougham et al. |
| 2009/0102500 | A1 | 4/2009 | An et al. |
| 2012/0086131 | A1 | 4/2012 | Wang |
| 2012/0193128 | A1 | 8/2012 | Olsen |
| 2013/0279134 | A1 | 10/2013 | Hayashi et al. |
| 2018/0068938 | A1 | 3/2018 | Yazdani |
| 2018/0074118 | A1* | 3/2018 | Worrall ................ H01L 23/345 |
| 2019/0082534 | A1 | 3/2019 | Hoang et al. |
| 2019/0082536 | A1 | 3/2019 | Park et al. |
| 2019/0319381 | A1 | 10/2019 | Bang et al. |
| 2019/0373729 | A1 | 12/2019 | Park et al. |
| 2020/0093040 | A1 | 3/2020 | Yun et al. |
| 2021/0099560 | A1 | 4/2021 | Kim et al. |
| 2021/0144856 | A1* | 5/2021 | Park ........................ H05K 1/145 |

FOREIGN PATENT DOCUMENTS

| KR | 10-2010-0047203 A | 5/2010 |
| KR | 10-2012-0017269 A | 2/2012 |
| KR | 10-2019-0029215 A | 3/2019 |
| KR | 10-2019-0119819 A | 10/2019 |
| KR | 10-2019-0135811 A | 12/2019 |
| KR | 10-2019-0139597 A | 12/2019 |
| KR | 10-2020-0032911 A | 3/2020 |
| KR | 10-2021-0037300 A | 4/2021 |
| WO | 2019/099989 A1 | 5/2019 |
| WO | 2019/199115 A1 | 10/2019 |
| WO | 2019/235731 A1 | 12/2019 |
| WO | 2020/060240 A1 | 3/2020 |

* cited by examiner

INTERPOSER AND ELECTRONIC DEVICE INCLUDING THE SAME

CROSS-REFERENCE TO RELATED APPLICATION(S)

This application is a continuation application, claiming the priority under § 365(c), of an International application No. PCT/KR2021/013135, filed on Sep. 27, 2021, which is based on and claims the benefit of a Korean patent application number 10-2020-0125622, filed on Sep. 28, 2020, in the Korean Intellectual Property Office, the disclosure of which is incorporated by reference herein in its entirety.

TECHNICAL FIELD

The disclosure relates to an interposer including a plurality of connecting structures and an electronic device including the interposer.

BACKGROUND ART

Advancing information communication and semiconductor technologies accelerate the spread and use of various electronic devices. For example, recent electronic devices are being developed to carry out communication while carrying out other operations.

The term "electronic device" may mean a device performing a particular function according to its equipped program, such as a home appliance, an electronic scheduler, a portable multimedia player, a mobile communication terminal, a tablet personal computer (PC), a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling or e-wallet function. Such electronic devices become compact enough for users to carry in a convenient way.

A plurality of printed circuit boards disposed in the inner space of the electronic device may be stacked to slim down the electronic device and are being developed to reduce the mounting space through mutually efficient electrical connecting structures. For example, a first circuit board and a second circuit board disposed in the electronic device may mount a plurality of components, and an interposer for electrically connecting the plurality of components may be disposed between the first and second circuit boards.

The above information is presented as background information only to assist with an understanding of the disclosure. No determination has been made, and no assertion is made, as to whether any of the above might be applicable as prior art with regard to the disclosure.

DISCLOSURE

Technical Problem

A plurality of circuit boards (e.g., first and second circuit boards) may be stacked in an electronic device. An interposer may be disposed between the first and second circuit boards, and a plurality of connecting structures may be disposed in the interposer to connect electrical signals of the first and second circuit boards. One conductive member electrically connected may be included in the plurality of connecting structures. The interposer may include more connecting structures than those included, for stable signal connection between the first and second circuit boards of the related art. An increase in the size (e.g., surface area) of the interposer may be an obstacle to diminishing the interposer. This may also inhibit slimming down the electronic device.

Aspects of the disclosure are to address at least the above-mentioned problems and/or disadvantages and to provide at least the advantages described below.

Accordingly, an aspect of the disclosure is to provide an interposer including connecting structures, which form a plurality of conductive members by separating a conductive member for multiple electrical connections without increasing the existing connecting structures, a method for manufacturing the interposer, and an electronic device including the interposer.

Additional aspects will be set forth in part in the description which follows and, in part, will be apparent from the description, or may be learned by practice of the presented embodiments.

Technical Solution

In accordance with an aspect of the disclosure, an interposer is provided. The interposer includes a substrate including a first surface facing in a first direction and a second surface facing in a second direction opposite to the first direction, and a plurality of connecting structures disposed on the substrate, the plurality of connecting structures electrically connecting a first circuit board and a second circuit board disposed in an electronic device. The plurality of connecting structures may include a plurality of via holes formed in the substrate, a plurality of conductive members disposed in the plurality of via holes, an insulating member disposed between the plurality of conductive members, a plurality of first pads disposed on the first surface of the substrate and disposed on an outer periphery of a first surface of the plurality of conductive members, and a plurality of second pads disposed on the second surface of the substrate and disposed on an outer periphery of a second surface, opposite to the first surface, of the plurality of conductive members. The plurality of conductive members may be separately disposed on the first and second surfaces of the substrate for electrical connection with the first and second circuit boards. The plurality of first and second pads may be disposed on the first and second surfaces of the substrate and on the outer peripheries of the first and second surfaces of the plurality of conductive members.

In accordance with another aspect of the disclosure, a method for manufacturing an interposer is provided. The method includes forming a substrate including a first surface facing in a first direction and a second surface facing in a second direction opposite to the first direction, forming a plurality of via holes in the substrate, plating the plurality of via holes with a conductive member, cutting at least a portion of the conductive member using a drilling tool to form a plurality of conductive members such that the plurality of conductive members are separately disposed, filling a space between the plurality of conductive members with an insulating member, disposing a plurality of first pads on the first surface of the substrate and on an outer periphery of a first surface of the plurality of conductive members, and disposing a plurality of second pads on the second surface of the substrate and on an outer periphery of a second surface, opposite to the first surface, of the plurality of conductive members.

In accordance with another aspect of the disclosure, an electronic device is provided. The electronic device includes a housing, a first circuit board disposed in the housing, a second circuit board spaced apart from the first circuit board, and an interposer disposed between the first and second circuit boards. The interposer may include a substrate including a first surface facing in a first direction and a second surface facing in a second direction opposite to the first direction, and a plurality of connecting structures disposed on the substrate and electrically connecting a first circuit board and a second circuit board disposed in the electronic device. The plurality of connecting structures may include a plurality of via holes formed in the substrate, a plurality of conductive members disposed in the plurality of via holes, an insulating member disposed between the plurality of conductive members, a plurality of first pads disposed on the first surface of the substrate and disposed on an outer periphery of a first surface of the plurality of conductive members, and a plurality of second pads disposed on the second surface of the substrate and disposed on an outer periphery of a second surface, opposite to the first surface, of the plurality of conductive members. The plurality of conductive members may be separately disposed on the first and second surfaces of the substrate for electrical connection with the first and second circuit boards. The plurality of first and second pads may be disposed on the first and second surfaces of the substrate and on the outer peripheries of the first and second surfaces of the plurality of conductive members.

In accordance with another aspect of the disclosure, an interposer is provided. The interposer includes a substrate and a plurality of connecting structures disposed on the substrate and electrically connecting a first circuit board and a second circuit board disposed in the electronic device. The plurality of connecting structures may include a plurality of via holes formed in the substrate, a plurality of conductive members disposed in the plurality of via holes, an insulating member disposed between the plurality of conductive members, and a plurality of pads disposed on the outer periphery of the plurality of conductive members. The plurality of conductive members may be separately disposed on the substrate to electrically connect with the first and second circuit boards.

Advantageous Effects

By at least any one of the above-described means to address the problems, a plurality of conductive members are provided separately in a plurality of connecting structures included in an interposer. Thus, the plurality of conductive members may make multiple electrical connections. For example, the plurality of conductive members may make stable electrical connections between a plurality of components included on the first and second circuit boards without increasing the number of connecting structures installed. According to various embodiments, the electronic device may enhance the electrical connection between the first and second circuit boards and reduce the size of the interposer using the plurality of conductive members. Further, as the size of the interposer is reduced, an electronic device including the interposer may also be diminished.

According to various embodiments, at least one of the plurality of connecting structures are disposed on the outer periphery of the circuit board and form a ground. Thus, at least one of the plurality of connecting structures, where the ground is formed, may shield the electromagnetic waves or interference generated from electronic components disposed outside the circuit board. For example, at least one of the plurality of connecting structures in which the ground is formed may serve as a shield can. Further, at least one of the remaining connecting structures, where the ground is not formed, may electrically connect the first and second circuit boards. Accordingly, the plurality of connecting structures may further enhance the function of the interposer.

Other aspects, advantages, and salient features of the disclosure will become apparent to those skilled in the art from the following detailed description, which, taken in conjunction with the annexed drawings, discloses various embodiments of the disclosure.

DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

MODE FOR INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
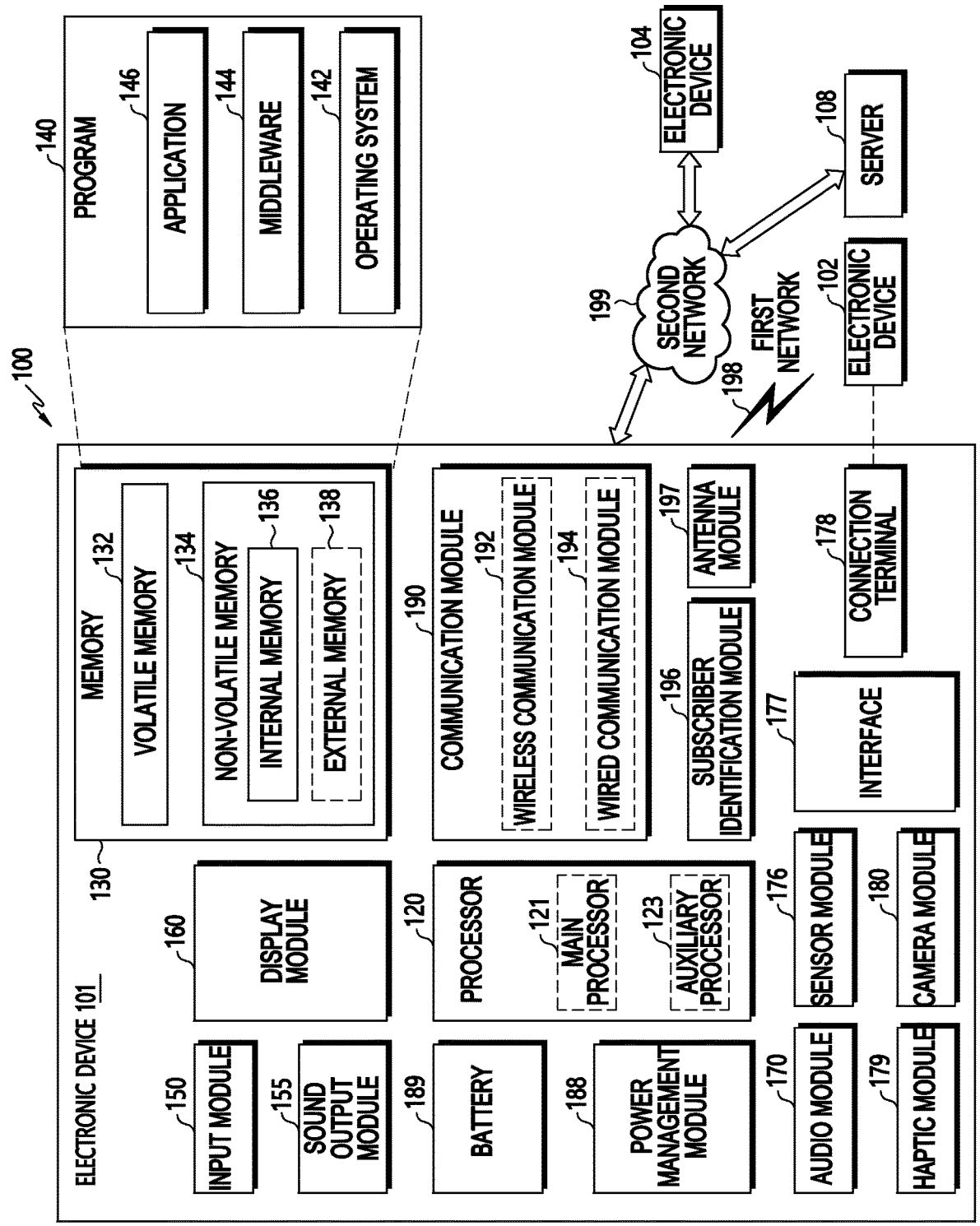
FIG. 1 is a block diagram illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
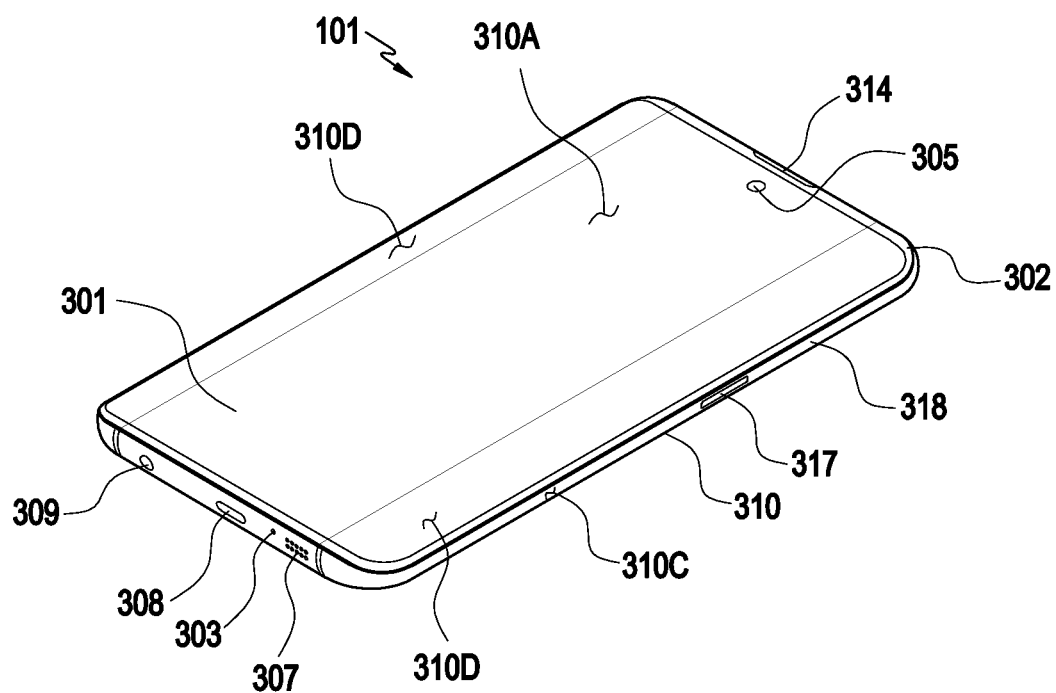
FIG. 2 is a front perspective view illustrating an electronic device according to an embodiment of the disclosure.
Figure 3:
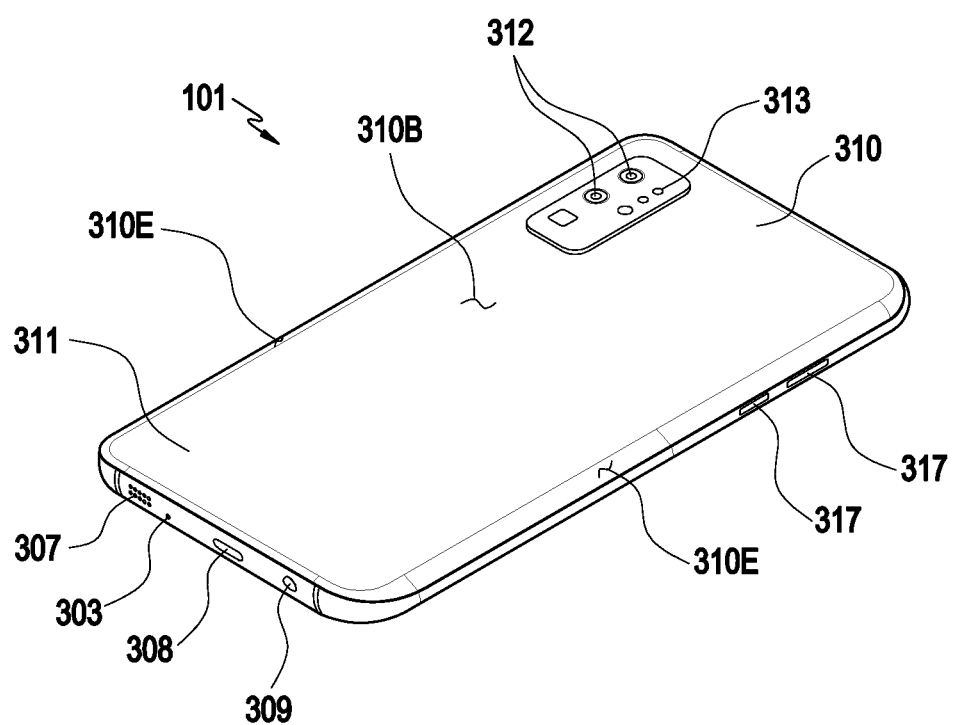
FIG. 3 is a rear perspective view illustrating an electronic device according to an embodiment of the disclosure.

FIG. 2 is a front perspective view illustrating an electronic device according to an embodiment of the disclosure. FIG. 3 is a rear perspective view illustrating an electronic device according to an embodiment of the disclosure.

Referring to FIGS. 2 and 3, according to an embodiment, an electronic device 101 may include a housing 310 with a front surface 310A, a rear surface 310B, and a side surface 310C surrounding a space between the front surface 310A and the rear surface 310B. According to another embodiment (not shown), the housing 310 may denote a structure forming part of the front surface 310A, the rear surface 310B, and the side surface 310C of FIG. 2. According to an embodiment, at least part of the front surface 310A may have a substantially transparent front plate 302 (e.g., a glass plate or polymer plate including various coat layers). The rear surface 310B may be formed by a rear plate 311. The rear plate 311 may be formed of, e.g., glass, ceramic, polymer, metal (e.g., aluminum, stainless steel (STS), or magnesium), or a combination of at least two thereof. The side surface 310C may be formed by a side bezel structure 318 (or a "side member") that couples to the front plate 302 and the rear plate 311 and includes a metal and/or polymer. According to an embodiment, the rear plate 311 and the side bezel plate 318 may be integrally formed together and include the same material (e.g., glass, metal, such as aluminum, or ceramic).

In the embodiment illustrated, the front plate 302 may include two first edge areas 310D, which seamlessly and bendingly extend from the first surface 310A to the rear plate 311, on both the long edges of the front plate 302. In the embodiment (refer to FIG. 3) illustrated, the rear plate 311 may include two second edge areas 310E, which seamlessly and bendingly extend from the rear surface 310B to the front plate, on both the long edges. According to an embodiment, the front plate 302 (or the rear plate 311) may include only one of the first edge areas 310 (or the second edge areas 310E). Alternatively, the first edge areas 310D or the second edge areas 301E may partially be excluded. According to an embodiment, at side view of the electronic device 101, the side bezel structure 318 may have a first thickness (or width) for sides that do not have the first edge areas 310D or the second edge areas 310E and a second thickness, which is smaller than the first thickness, for sides that have the first edge areas 310D or the second edge areas 310E.

According to an embodiment, the electronic device 101 may include at least one of a display 301, audio modules 303, 307, and 314 (e.g., audio module 170 of FIG. 1), a sensor module (e.g., sensor module 176 of FIG. 1), camera modules 305, 312, and 313 (e.g., camera module 180 of FIG. 1), a key input device 317 (e.g., input module 150 of FIG. 1), and connector holes 308 and 309 (e.g., connection terminal 178 of FIG. 1). According to an embodiment, the electronic device 101 may exclude at least one (e.g., the connector hole 309) of the components or may add other components.

According to an embodiment, the display 301 may be visually exposed through, e.g., a majority portion of the front plate 302. According to an embodiment, at least a portion of the display 301 may be exposed through the front plate 302 forming the front surface 310A and the first edge areas 310D. According to an embodiment, the edge of the display 301 may be formed to be substantially the same in shape as an adjacent outer edge of the front plate 302. According to another embodiment (not shown), the interval between the outer edge of the display 301 and the outer edge of the front plate 302 may remain substantially even to give a larger area of exposure the display 301.

According to an embodiment, the surface (or the front plate 302) of the housing 310 may include a screen display area formed as the display 301 is visually exposed. For example, the screen display area may include the front surface 310A and first edge areas 310D.

According to another embodiment (not shown), a recess or opening may be formed in a portion of the screen display area (e.g., the front surface 310A or the first edge area 310D) of the display 301, and at least one or more of the audio module 314, sensor module (not shown), light emitting device (not shown), and camera module 305 may be aligned with the recess or opening. According to another embodiment (not shown), at least one or more of the audio module 314, sensor module (not shown), camera module 305, fingerprint sensor (not shown), and light emitting device (not shown) may be included on the rear surface of the screen display area of the display 301. According to an embodiment (not shown), the display 301 may be disposed to be coupled with, or adjacent to, a touch detecting circuit, a pressure sensor capable of measuring the strength (pressure) of touches, and/or a digitizer for detecting a magnetic field-type stylus pen. According to an embodiment, at least part of the key input device 317 may be disposed in the first edge areas 310D and/or the second edge areas 310E.

According to an embodiment, the electronic device 101 has a bar-type or plate-type appearance but the disclosure is not limited thereto. For example, the illustrated electronic device may be part of a foldable electronic device and/or a rollable electronic device. The term "foldable electronic device" and/or "rollable electronic device" means an electronic device at least a portion of which may be folded or wound or rolled or received in a housing (e.g., the housing 310 of FIGS. 2 and 3) as the display (e.g., the display 301 of FIG. 2) may be bent and deformed. The foldable electronic device and/or the rollable electronic device allows for expansion and use of the screen display area by allowing by unfolding the display or exposing a larger area of the display to the outside according to the user's need.

According to an embodiment, the audio modules 303, 307, and 314 may include, e.g., a microphone hole 303 and speaker holes 307 and 314. The microphone hole 303 may have a microphone inside to obtain external sounds. According to an embodiment, there may be a plurality of microphones to be able to detect the direction of a sound. The speaker holes 307 and 314 may include an external speaker hole 307 and a phone receiver hole 314. According to an embodiment, the speaker holes 307 and 314 and the microphone hole 303 may be implemented as a single hole, or speakers may be rested without the speaker holes 307 and 314 (e.g., piezo speakers). The audio modules 303, 307, and 314 are not limited to the above-described structure. Depending on the structure of the electronic device 101, various design changes may be made—e.g., only some of the audio modules may be mounted, or a new audio module may be added.

According to an embodiment, the sensor modules (not shown) may generate an electrical signal or data value corresponding to an internal operating state or external environmental state of the electronic device 101. The sensor modules (not shown) may include a first sensor module (e.g., a proximity sensor) and/or a second sensor module (e.g., a fingerprint sensor) disposed on the front surface 310A of the housing 310 and/or a third sensor module (e.g., an HRM sensor) and/or a fourth sensor module (e.g., a fingerprint sensor) disposed on the rear surface 310B of the housing 310. In an embodiment (not shown), the fingerprint sensor may be disposed on the rear surface 310B as well as on the front surface 310A (e.g., the display 301) of the housing 310. The electronic device 101 may include a sensor module not shown, e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor. The sensor modules are not limited to the above-described structure. Depending on the structure of the electronic device 101, various design changes may be made—e.g., only some of the sensor modules may be mounted, or a new sensor module may be added.

According to an embodiment, the camera modules 305, 312, and 313 may include a first camera module 305 disposed on the first surface 310A of the electronic device 101, and a rear camera device 312 and/or a flash 313 disposed on the rear surface 310B. The camera modules 305 and 312 may include one or more lenses, an image sensor, and/or an image signal processor. The flash 313 may include, e.g., a light emitting diode (LED) or a xenon lamp. According to an embodiment, two or more lenses (an infrared (IR) camera, a wide-angle lens, or a telescopic lens) and image sensors may be disposed on one surface of the electronic device 101. The camera modules 305, 312, and 313 are not limited to the above-described structure. Depending on the structure of the electronic device 101, various design changes may be made—e.g., only some of the camera modules may be mounted, or a new camera module may be added.

According to an embodiment, the electronic device 101 may include a plurality of camera modules (e.g., a dual camera or triple camera) having different attributes (e.g., angle of view) or functions. For example, a plurality of camera modules 305 and 312 including lenses having different angles of view may be configured, and the electronic device 101 may control to change the angle of view of the camera modules 305 and 312 performed by the electronic device 101 based on the user's selection. At least one of the plurality of camera modules 305 and 312 may form, for example, a wide-angle camera and at least another of the plurality of camera modules may form a telephoto camera. Similarly, at least one of the plurality of camera modules 305 and 312 may form, for example, a front camera and at least another of the plurality of camera modules may form a rear camera. Further, the plurality of camera modules 305 and 312 may include at least one of a wide-angle camera, a telephoto camera, or an infrared (IR) camera (e.g., a time of flight (TOF) camera, a structured light camera). According to an embodiment, the IR camera may be operated as at least a portion of the sensor module. For example, the TOF camera may be operated as at least a portion of a sensor module (not shown) for detecting the distance to the subject.

According to an embodiment, the key input device 317 may be disposed on the side surface 310C of the housing 310. According to an embodiment, the electronic device 101 may exclude all or some of the above-mentioned key input devices 317 and the excluded key input devices 317 may be implemented in other forms, e.g., as soft keys, on the display 301. According to an embodiment, the key input device may include the sensor module (not shown) disposed on the second surface 310B of the housing 310.

According to an embodiment, the light emitting device (not shown) may be disposed on, e.g., the front surface 310A, of the housing 310. The light emitting device (not shown) may provide, e.g., information about the state of the electronic device 101 in the form of light. According to another embodiment, the light emitting device (not shown) may provide a light source that interacts with, e.g., the front camera module 305. The light emitting device (not shown) may include, e.g., a light emitting device (LED), an infrared (IR) LED, and/or a xenon lamp.

According to an embodiment, the connector holes 308 and 309 may include, e.g., a first connector hole 308 for receiving a connector (e.g., a universal serial bus (USB) connector) for transmitting or receiving power and/or data to/from an external electronic device and/or a second connector hole (e.g., an earphone jack) 309 for receiving a connector for transmitting or receiving audio signals to/from the external electronic device.

According to an embodiment, some 305 of the camera modules 305 and 312 and/or some of the sensor modules (not shown) may be disposed to be exposed to the outside through at least a portion of the display 301. For example, the camera module 305 may include a punch hole camera disposed inside a hole or recess formed in the rear surface of the display 301. According to an embodiment, the camera module 312 may be disposed inside the housing 310 so that the lens is exposed to the second surface 310B of the electronic device 101. For example, the camera module 312 may be disposed on a printed circuit board (e.g., printed circuit board 340 of FIG. 4).

According to an embodiment, the camera module 305 and/or the sensor module may be disposed to contact the external environment through a transparent area from the internal space of the electronic device 101 to the front plate 302 of the display 301. Further, the camera module 305 and/or the sensor module (not shown) may be disposed to perform its functions without being visually exposed through the front plate 302 in the internal space of the electronic device. For example, the camera module 305 may include an under display camera (UDC).

Figure 4:
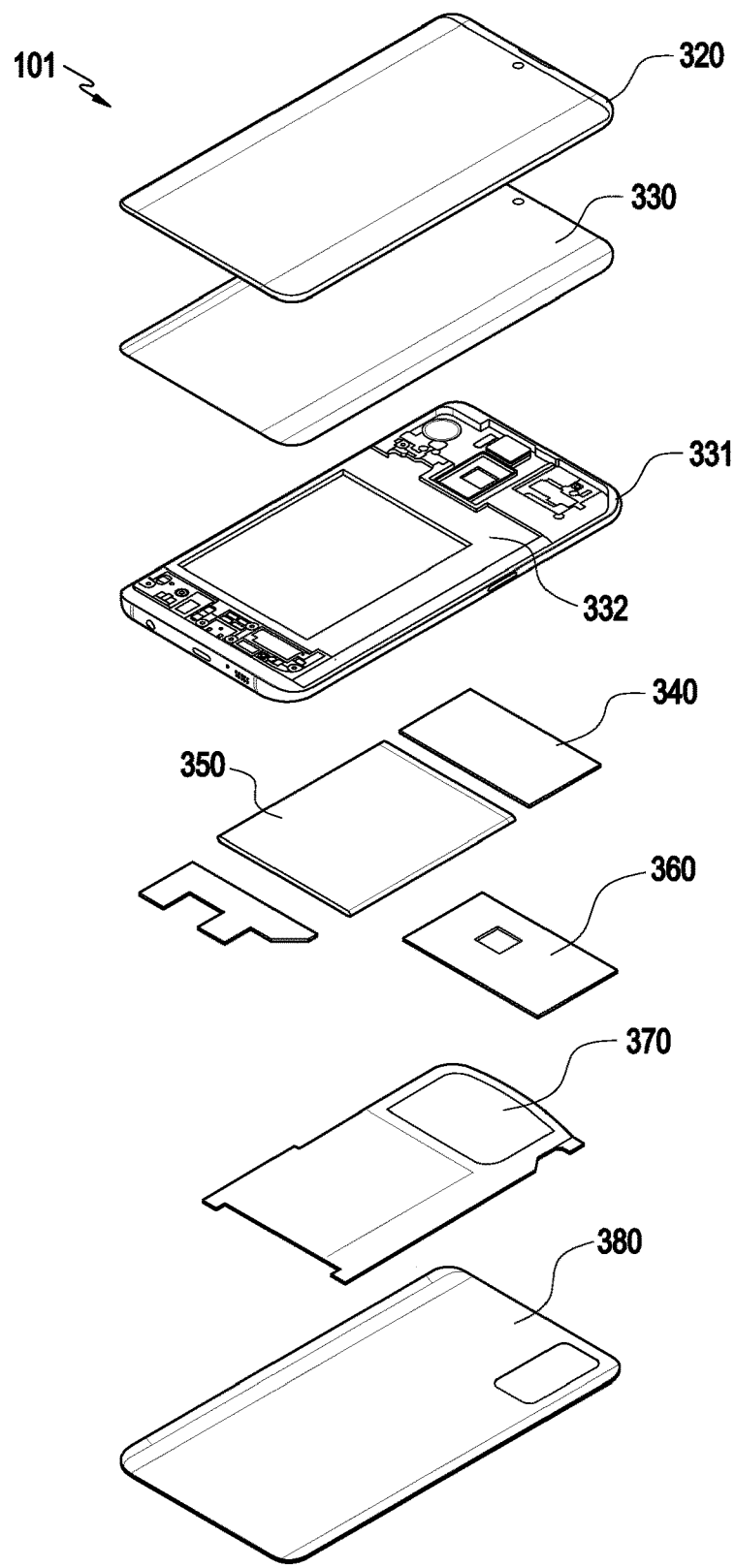
FIG. 4 is an exploded perspective view illustrating an electronic device according to an embodiment of the disclosure.

FIG. 4 is an exploded perspective view illustrating an electronic device according to an embodiment of the disclosure.

Referring to FIG. 4, according to various embodiments, an electronic device 101 (e.g., electronic device 101 of FIGS. 1 to 3) may include a side bezel structure 331 (e.g., side bezel structure 318 of FIG. 2), a first supporting member 332, a front plate 320 (e.g., front plate 302 of FIG. 2), a display 330 (e.g., display 301 of FIG. 2), a printed circuit board 340 (e.g., a PCB, flexible PCB (FPCB), or rigid flexible PCB (RFPCB)), a battery 350 (e.g., battery 189 in FIG. 1), a second supporting member 360 (e.g., a rear case), an antenna 370 (e.g., antenna module 197 of FIG. 1), and a rear plate 380 (e.g., rear plate 311 of FIG. 2). According to an embodiment, the electronic device 101 may exclude at least one (e.g., first supporting member 332 or second supporting member 360) of the components or may add other components. At least one of the components of the electronic device 101 may be the same or similar to at least one of the components of the electronic device 101 of FIG. 2 or 3 and no duplicate description is made below.

According to various embodiments, the side bezel structure 331 may be positioned between the display 330 and the rear plate 380 and may include a metal frame structure (not shown). For example, the metal frame structure (not shown) of the side bezel structure 331 may be formed of a conductive material (e.g., metal) and may form a side surface (e.g., the side surface 310C of FIG. 2) of the electronic device 101. For example, the metal frame structure (not shown) may include at least one conductive portion and/or at least one non-conductive portion insulating the at least one conductive portion. At least one conductive portion of the metal frame structure (not shown) may operate as an antenna radiator for transmitting and/or receiving a radio frequency (RF) signal of a designated frequency band.

According to various embodiments, the first supporting member 332 may be disposed inside the electronic device 101 to be connected with the side bezel structure 331 or integrated with the side bezel structure 331. The first supporting member 332 may be formed of, e.g., a metal and/or non-metallic material (e.g., polymer). The display 330 may be joined onto one surface of the first supporting member 332, and the printed circuit board 340 may be joined onto the opposite surface of the first supporting member 311.

According to various embodiments, a processor, a memory, and/or an interface may be mounted on the printed circuit board 340. The processor may include one or more of, e.g., a central processing unit, an application processor, a graphic processing device, an image signal processing, a sensor hub processor, or a communication processor. According to various embodiments, the printed circuit board 340 may include a flexible printed circuit board type radio frequency cable (FRC). For example, the printed circuit board 340 may be disposed on at least a portion of the first supporting member 332 and may be electrically connected with an antenna module (e.g., antenna module 197 of FIG. 1) and a communication module (e.g., communication module 190 of FIG. 1).

According to an embodiment, the memory may include, e.g., a volatile or non-volatile memory.

According to an embodiment, the interface may include, for example, a high definition multimedia interface (HDMI), a universal serial bus (USB) interface, a secure digital (SD) card interface, and/or an audio interface. The interface may electrically or physically connect, e.g., electronic device 101 with an external electronic device and may include a USB connector, an SD card/multimedia card (MMC) connector, or an audio connector.

According to an embodiment, the battery 350 may be a device for supplying power to at least one component of the electronic device 101. The battery 350 may include, e.g., a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

According to various embodiments, the second supporting member 360 (e.g., a rear case) may be disposed between the printed circuit board 340 and the antenna 370. For example, the second supporting member 360 may include one surface to which at least one of the printed circuit board 340 and the battery 350 is coupled, and another surface to which the antenna 370 is coupled.

According to an embodiment, the antenna 370 may be disposed between the rear plate 380 and the battery 350. The antenna 370 may include, e.g., a near-field communication (NFC) antenna, a wireless charging antenna, and/or a magnetic secure transmission (MST) antenna. The antenna 370 may perform short-range communication with, e.g., an external device or may wirelessly transmit or receive power necessary for charging. According to an embodiment, an antenna structure may be formed by a portion or combination of the side bezel structure 331 and/or the first supporting member 332.

According to various embodiments, the rear plate 380 may form at least a portion of the rear surface (e.g., second surface 310B of FIG. 3) of the electronic device 101.

Figure 5:
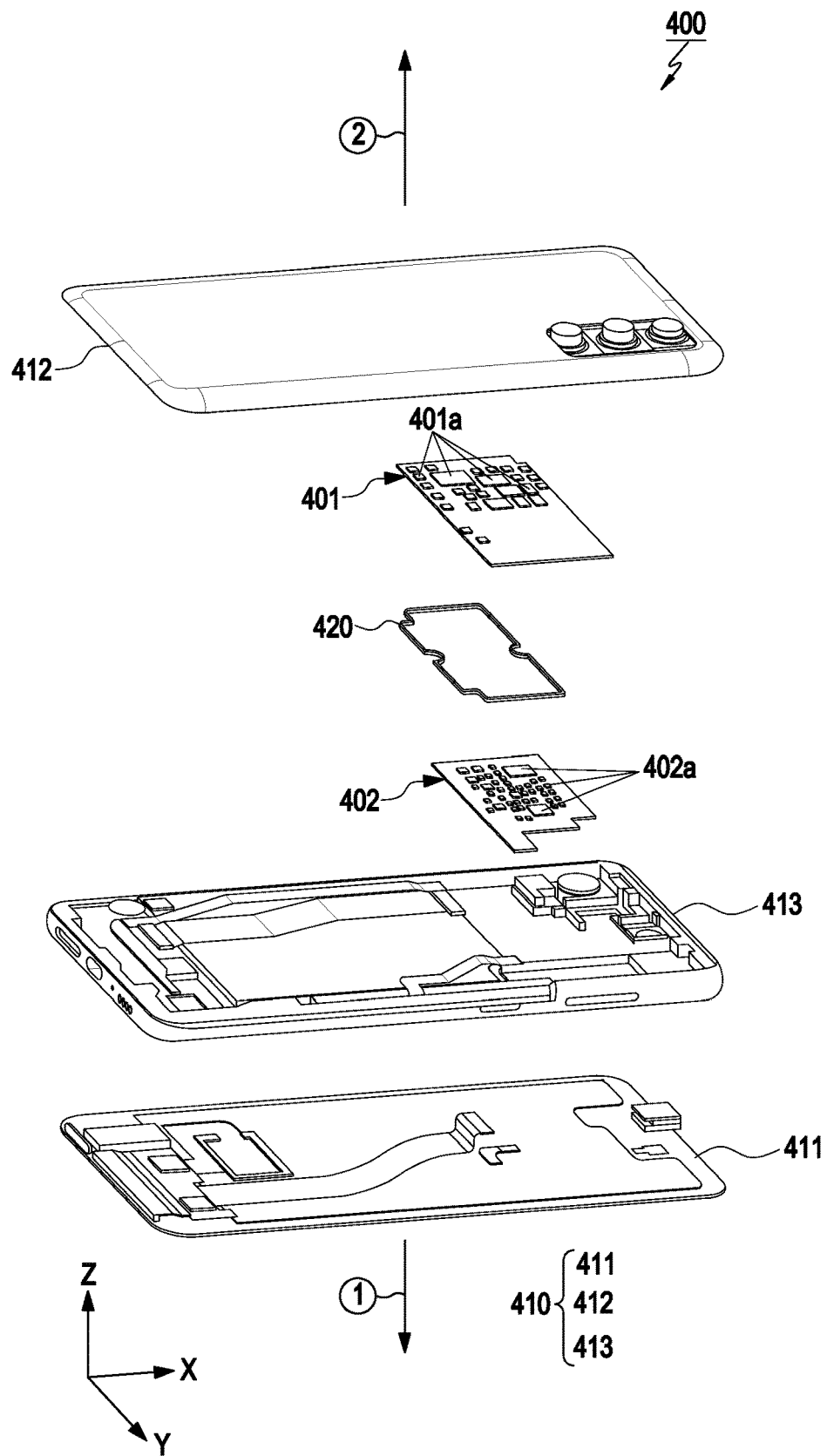
FIG. 5 is an exploded perspective view illustrating an interposer included in an electronic device according to an embodiment of the disclosure.
Figure 6:
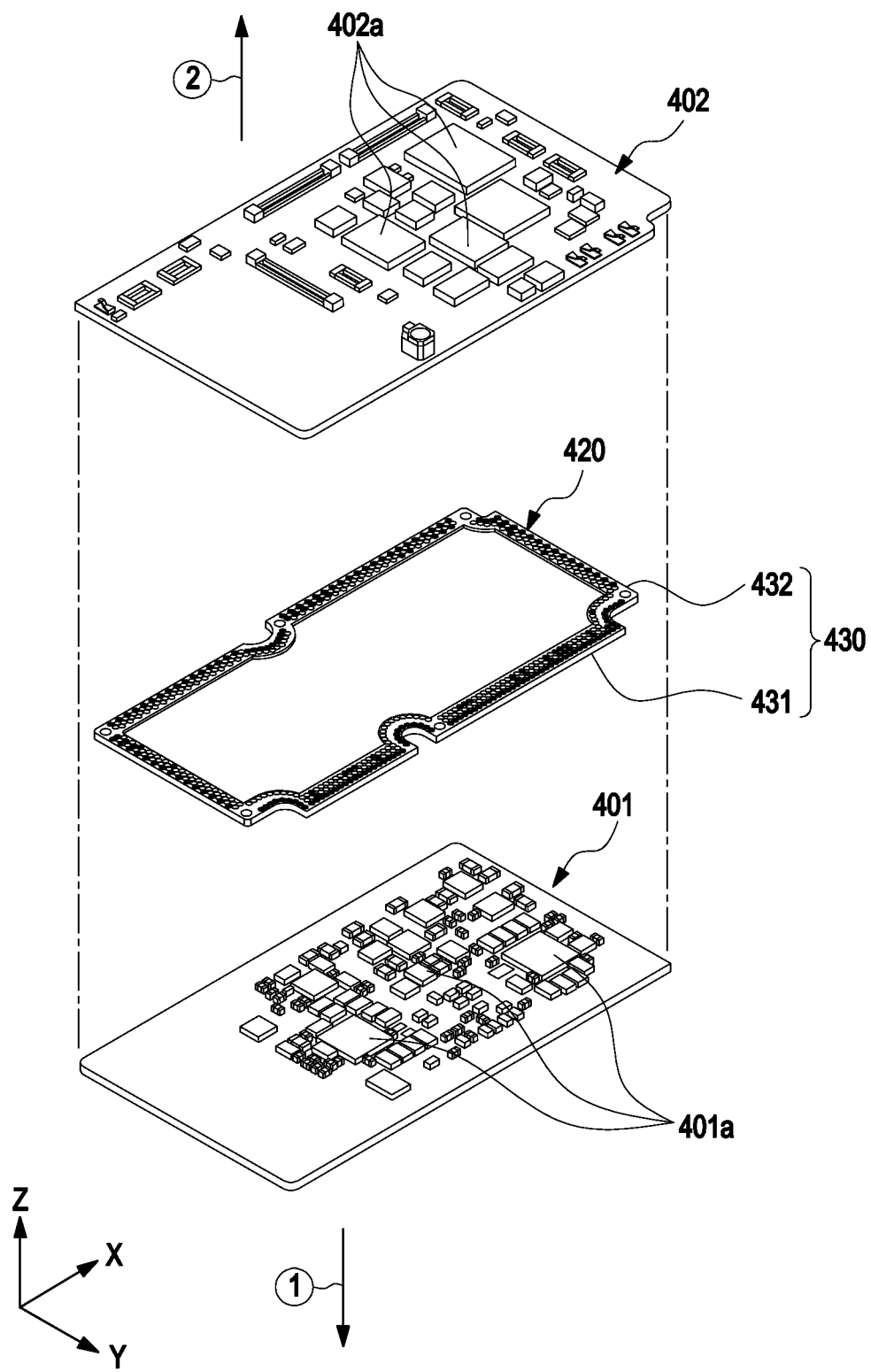
FIG. 6 is an exploded perspective view illustrating a first and second circuit board and an interposer among components of an electronic device, according to an embodiment of the disclosure.
Figure 7:
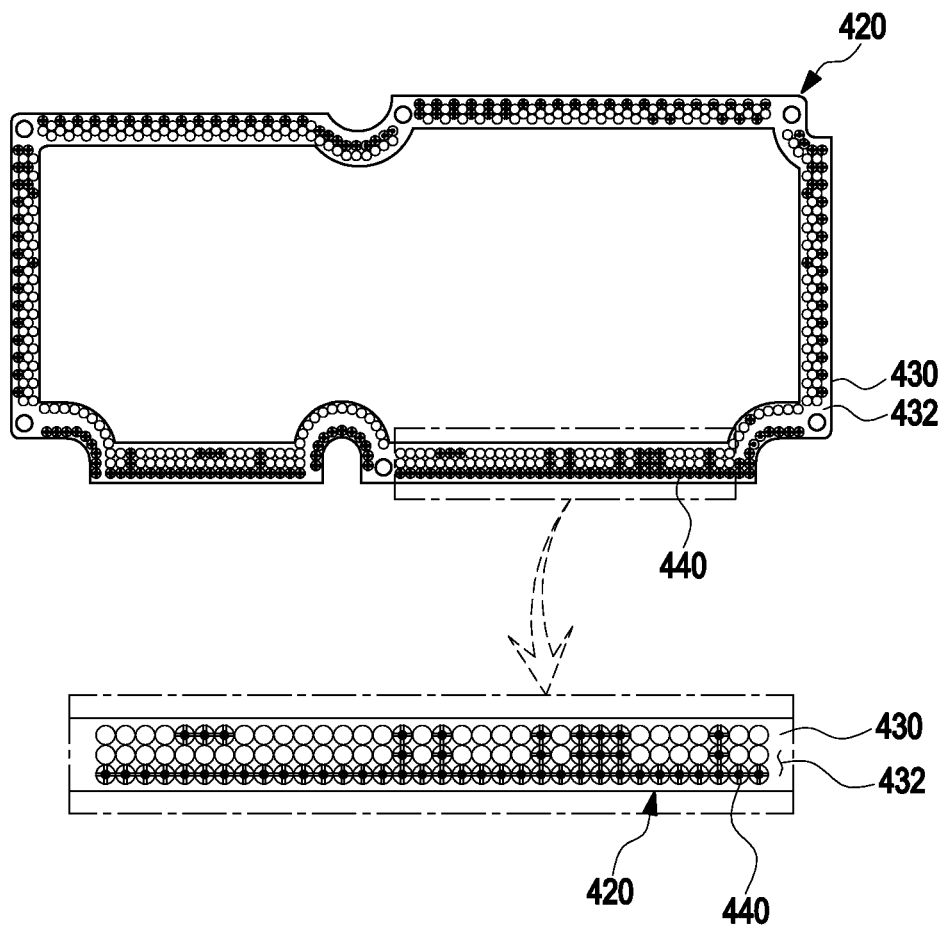
FIG. 7 is a plan view illustrating an interposer including a plurality of connecting structures, according to an embodiment of the disclosure.

FIG. 5 is an exploded perspective view illustrating an interposer 420 included in an electronic device 400 according to an embodiment of the disclosure. FIG. 6 is an exploded perspective view illustrating a first and second circuit board 401 and 402 and an interposer 420 among components of an electronic device 400, according to an embodiment of the disclosure. FIG. 7 is a plan view illustrating an interposer 420 including a plurality of connecting structures 440, according to an embodiment of the disclosure.

The electronic device 400 of FIG. 5 may be at least partially similar to the electronic device 101 of FIG. 1 or may include another embodiment of the electronic device.

Referring to FIGS. 5 to 7, according to various embodiments, the electronic device 400 may include a housing 410, first and second circuit boards 401 and 402, a plurality of first and second components 401a and 402a, and an interposer 420. For example, the housing 410 may include a first plate 411 (e.g., front plate 320 of FIG. 4) facing in a first direction ①, a display (e.g., display 330 of FIG. 4), a second plate 412 (e.g., rear plate 380 of FIG. 4) facing in a second direction ② opposite to the first direction, and a side surface member 413 (e.g., side bezel structure 331 of FIG. 4 or a side frame) surrounding a space between the first and second plates 411 and 412.

According to various embodiments, the first and second circuit boards 401 and 402 may be stacked on the rear surface (e.g., −Z direction) of the second plate 412, inward of the housing 410. For example, the second circuit board 402 may be disposed on the rear surface of the second plate 412, and the first circuit board 401 may be disposed to be spaced apart from the rear surface of the second circuit board 402. According to another embodiment, the first circuit board 401 may be disposed on the rear surface of the second plate 412, and the second circuit board 402 may be disposed to be spaced apart from the rear surface of the first circuit board 401.

According to various embodiments, the first circuit board 401 or the second circuit board 402 may include a secondary printed circuit board (not shown) (secondary PCB) or a primary printed circuit board (not shown) (primary PCB). In one embodiment, the first circuit board 401 may include the secondary printed circuit board (not shown), and the second circuit board 402 may include the primary printed circuit board (not shown). In an embodiment, the plurality of first components 401a may be arranged on the first circuit board 401, and the plurality of second components 402a may be arranged on the second circuit board 402. According to an embodiment, the first circuit board 401 and/or the second circuit board 402 may be a printed circuit board (PCB) formed of a material (e.g., FR4) having non-bendable characteristics or may be a flexible printed circuit board (FPCB) having bendable characteristics (or "flexible characteristics"). For example, the first circuit board 401 and/or the second circuit board 402 may include an area (hereinafter, referred to as a "flexible area") having a bendable or flexible property. In one embodiment, the flexible area may include a base film (or substrate) and a copper clad layer. For example, the flexible area may be a flexible copper clad layer (FCCL) in which at least one copper clad is stacked on at least a portion of at least one of an upper end or a lower end of a polyimide film.

According to various embodiments, the plurality of first and second components 401a and 402a may include at least one of a microphone, a speaker, a memory card, a processor, a plurality of sensors, an antenna, a plurality of connectors, an inductor, an active element, a passive element, and a circuit element. In the embodiment, the plurality of first and second parts 401a and 402a are the plurality of components described above, but are not limited thereto. For example, the plurality of first and second components 401a and 402a may be other various components that are included in the electronic device 400. Further, the plurality of first and second components 401a and 402a may be heat sources that generate heat. For example, the plurality of first and second components 401 and 402a may be at least one of a power management integrated circuit), a power amplifier (PAM), an application processor (AP), a communication processor (CP), a charger integrated circuit (IC), or a display driver integrated circuit (DDI).

According to an embodiment, a shielding structure (or a "shield can") may be included in at least a portion of the first circuit board 401 and/or the second circuit board 402 to protect the plurality of first and second components 401a and 402a. For example, the shielding structure may be formed of a conductive material (e.g., metal) and may electromagnetically shield the plurality of first and second components 401a and 402a. In an embodiment, the shielding structure may be at least partially disposed on the second circuit board 402 (e.g., disposed in the second direction $\hat{2}$) and may electromagnetically shield the plurality of second components 402a disposed on the second circuit board 402.

According to various embodiments, the interposer 420 may be disposed between the first and second circuit boards 401 and 402 and may electrically connect the first and second circuit boards 401 and 402. For example, while the interposer 420 is disposed between the first and second circuit boards 401 and 402, a mounting space may simultaneously be formed between the first and second circuit boards 401 and 402 to form the plurality of first and second components 401a and 402a. According to an embodiment, the interposer 420 may have a copper clad laminate (CCL) structure including a plurality of preimpregnated (PREPREG, PPG) materials layers (e.g., insulating resin layers) and a copper clad disposed therebetween.

According to various embodiments, the interposer 420 may be disposed along the outer periphery of the first and second circuit boards 401 and 402. For example, the interposer 420 may include a substrate 430 and a plurality of connecting structures 440. For example, the substrate 430 may include a first surface 431 facing in the first direction $\hat{1}$ and a second surface 432 facing in the second direction $\hat{2}$ opposite to the first direction $\hat{1}$. For example, the substrate 430 may be disposed along the outer periphery of the first and second circuit boards 401 and 402. For example, the substrate 430 may include a substrate having a closed loop shape. For example, the substrate 430 may be formed overall in a closed loop shape. In one embodiment, the interposer 420 may include a substrate 430 including at least one side wall and/or at least one conductive via passing through at least one area of the substrate 430. For example, the first circuit board 401 and the second circuit board 402 may be electrically connected with each other through at least one conductive via of the interposer 420.

At least one of the plurality of connecting structures 440 may be disposed on the first surface 431 of the substrate 430 and electrically connected to the rear surface (e.g., the second direction $\hat{2}$) of the first circuit board 401. At least one of the plurality of connecting structures 440 may be disposed on the second surface 432 which faces away from the first surface 431 of the substrate 430 to connect to the front surface (e.g., the first direction $\hat{1}$) of the second circuit board 402. For example, the plurality of first components 401a disposed on the first circuit board 401 and the plurality of second components 402a disposed on the second circuit board 402 may be electrically and/or operatively connected through the interposer 420. According to various embodiments, in the electronic device 400, the first circuit board 401 and/or the second circuit board 402 may be electrically connected with a third circuit board (not shown) disposed to be spaced apart from the first circuit board 401 and/or the second circuit board 402. For example, the first circuit board 401 and/or the second circuit board 402 may be disposed in one area (e.g., an area in the +X direction of FIG. 5) of the electronic device 400, and the third circuit board (not shown) may be disposed in another area (e.g., an area in the −X direction of FIG. 5) spaced apart from the first circuit board 401 and/or the second circuit board 402. In an embodiment, the first circuit board 401 and/or the second circuit board 402 and the third circuit board (not shown) may be electrically connected through an electrical connecting member. For example, the electrical connecting member may electrically connect the first circuit board 401 and/or the second circuit board 402 and the third circuit board (not shown) across the battery (e.g., the battery 350 of FIG. 4). For example, the electrical connecting member may include at least one of a flexible printed circuit board (FPCB), a coaxial cable, and a board-to-board (B-to-B) connector but is not limited thereto.

Figure 8:
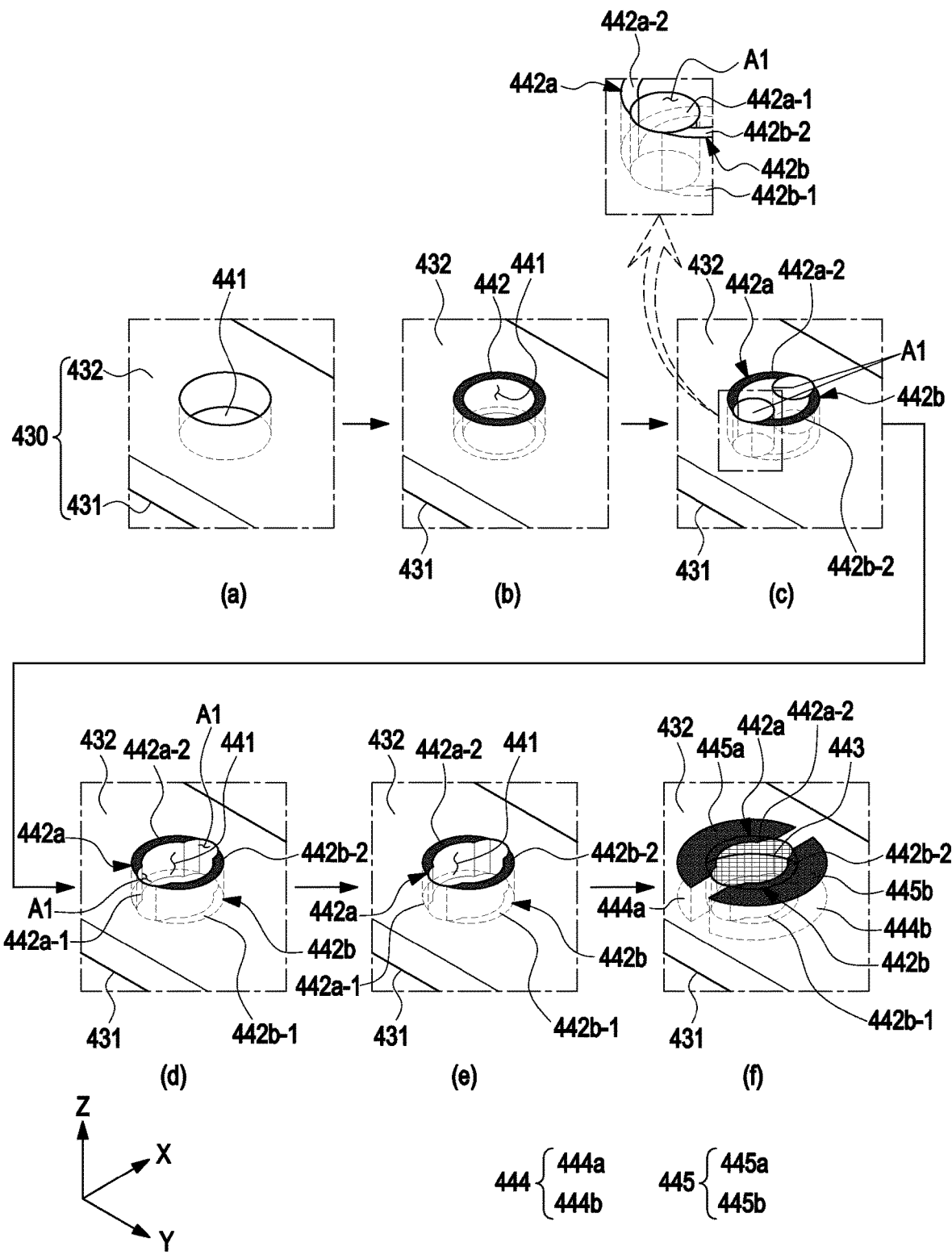
FIG. 8 is a perspective view illustrating a manufacturing process of a plurality of connecting structures, according to an embodiment of the disclosure.
Figure 9:
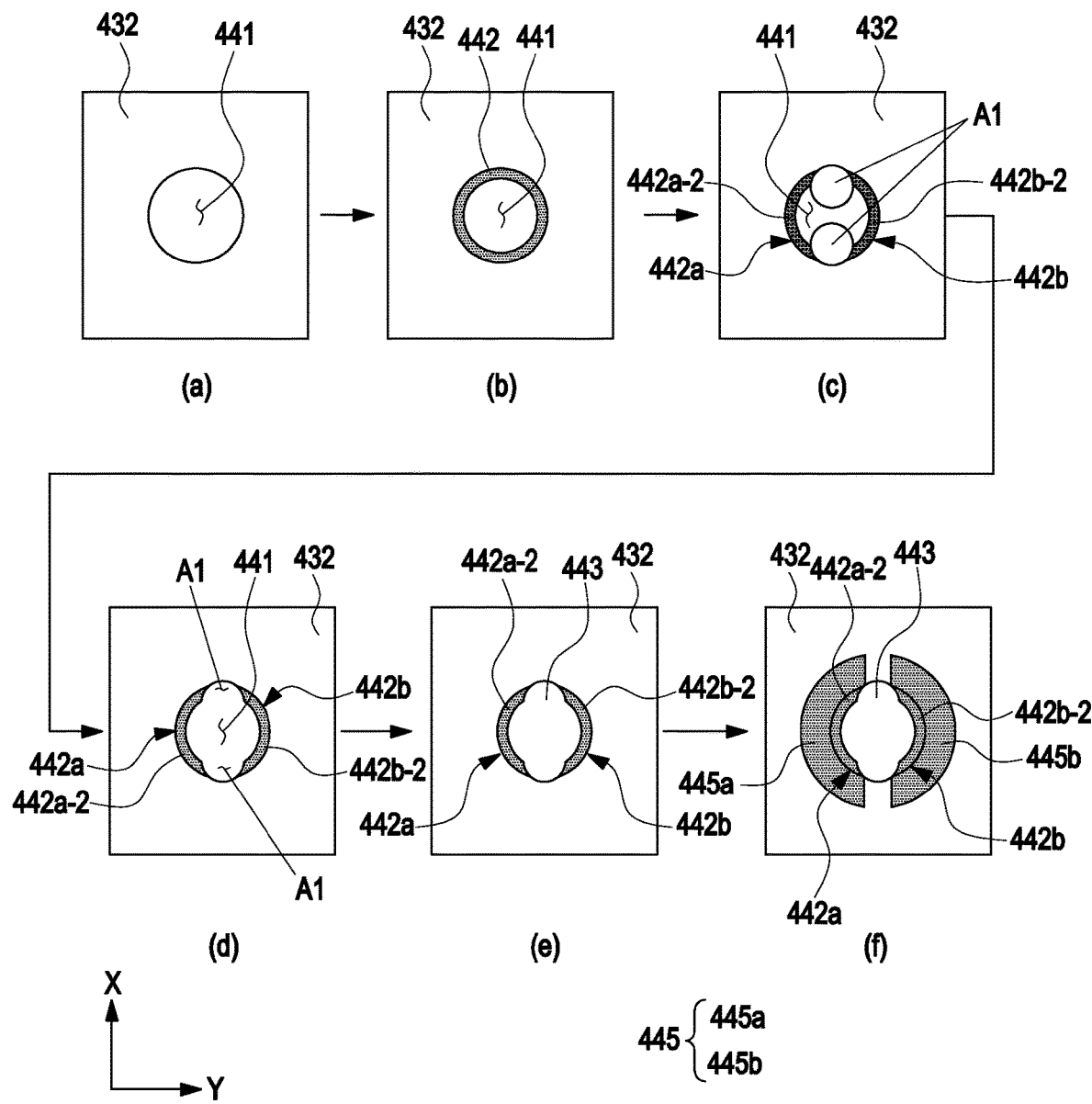
FIG. 9 is a plan view illustrating a manufacturing process of a plurality of connecting structures, according to an embodiment of the disclosure.
Figure 10:
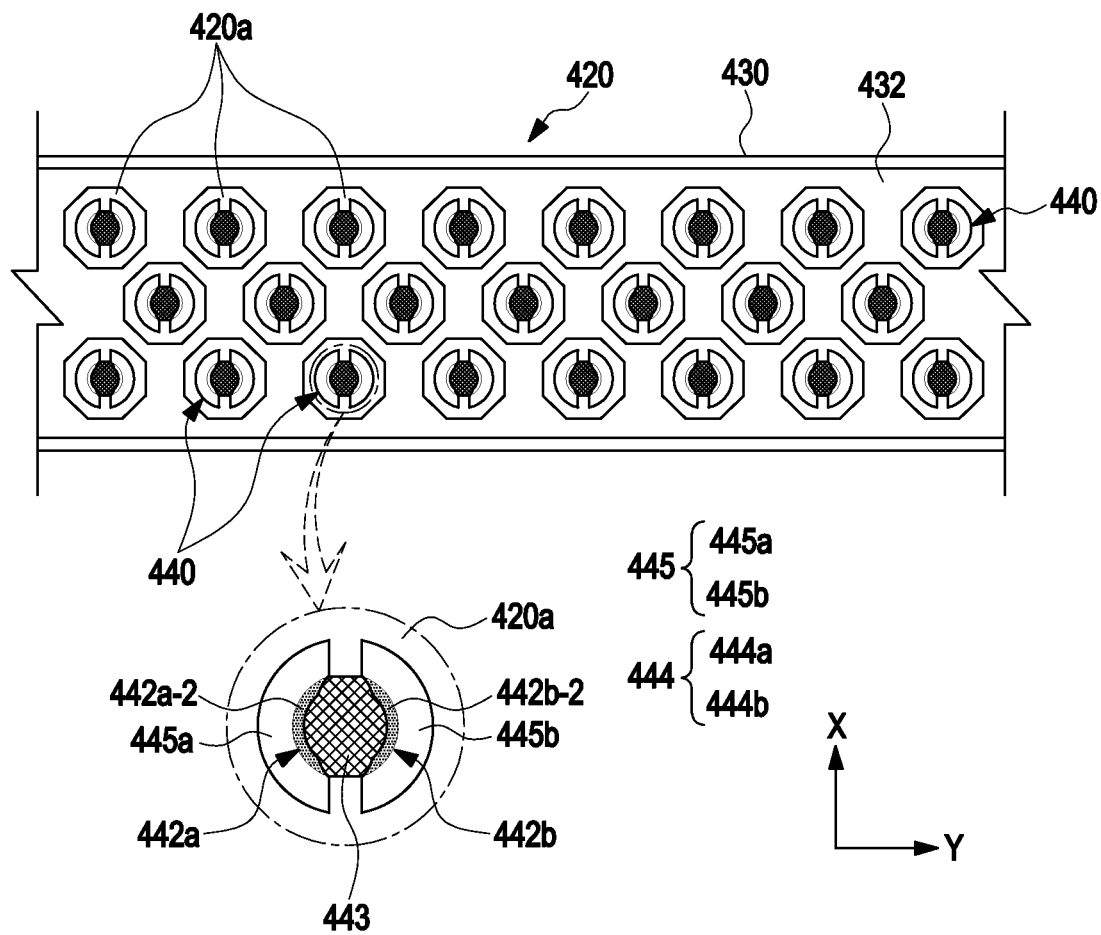
FIG. 10 is an enlarged plan view illustrating a plurality of connecting structures, according to an embodiment of the disclosure.

FIG. 8 is a perspective view illustrating a manufacturing process of a plurality of connecting structures 440, according to an embodiment of the disclosure. FIG. 9 is a plan view illustrating a manufacturing process of a plurality of connecting structures 440, according to an embodiment of the disclosure. FIG. 10 is an enlarged plan view illustrating a plurality of connecting structures 440, according to an embodiment of the disclosure.

Referring to FIGS. 8 to 10, the plurality of connecting structures 440 may include a plurality of via holes 441, a plurality of conductive members 442, an insulating member 443, and a plurality of first and second pads 444 and 445. For example, a plurality of arrangement areas 420*a* may be formed on the substrate 430 of the interposer 420 to arrange the plurality of connecting structures 440. As shown in (a) of FIGS. 8 and 9, the plurality of via holes 441 may be formed in the plurality of arrangement areas 420*a*.

According to an embodiment, the conductive member 442 may be plated on the inside of the plurality of via holes 441. The conductive member 442 may be formed in a ring shape. For example, as shown in (b) of FIGS. 8 and 9, the conductive member 442 may be formed in a ring shape along the inner periphery of the plurality of via holes 441. For example, the conductive member 442 may include at least one of an elliptical shape, a rectangular shape, or a rhombus shape other than the ring shape. For example, the conductive member 442 may be formed in other various shapes other than the aforementioned shapes.

According to an embodiment, as shown in (c) of FIGS. 8 and 9, at least a portion of the conductive member 442 may be cut by a drilling tool (not shown), forming at least one hole A1. For example, at least one hole A1 may be formed in the upper and lower sides of the conductive member 442 using the drilling tool. For example, the drilling tool may move up and down along the Z direction, forming at least one hole A1 in the upper and lower sides of the conductive member 442. For example, the at least one hole A1 may be formed along the X direction, and it may be formed in a cylindrical shape. For example, the conductive member 442 may be separated by the at least one hole A1. The conductive member 442 may be separated into first and second conductive members 442*a* and 442*b*. According to an embodiment, drilling using a drilling tool is an example of forming at least one hole A1. According to another embodiment, at least one hole A1 may be formed by laser processing or punching.

According to an embodiment, an insulating member 443 (e.g., dielectric) may fill a space formed between the first and second conductive members 442*a* and 442*b* as shown in (d) of FIGS. 8 and 9. According to an embodiment, as shown in (e) of FIGS. 8 and 9, the insulating member 443 may fill the space between the first and second conductive members 442*a* and 442*b*, electrically insulating the first and second conductive members 442*a* and 442*b*. For example, the first and second conductive members 442*a* and 442*b* may be independently electrically connected by the insulating member 443. According to an embodiment, the area protruding in the upper and/or lower direction (e.g., the +Z direction and/or the −Z direction) of the insulating member 443 may be removed through a planarization process. For example, the first surface 431 and/or the second surface 432 of the substrate 430 may be planarized through brushing or buffing. In another embodiment, the first surface 431 and/or the second surface 432 of the substrate 430 may be planarized through a polishing process. For example, the polishing process may include at least one of mechanical polishing and chemical mechanical polishing (CMP).

According to an embodiment, as shown in (f) of FIGS. 8 and 9, a plurality of first pads 444 may be disposed on the outer periphery of the first and second conductive members 442*a* and 442*b*. For example, at least one of the plurality of first pads 444 may be disposed on the outer periphery of the first surfaces 442*a*-1 and 442*b*-1 of the first and second conductive members 442*a* and 442*b*. For example, the plurality of first pads 444 may be disposed on the first surface 431 of the substrate 430.

Further, at least one of the plurality of second pads 445 may be disposed on the outer periphery of the second surfaces 442*a*-2 and 442*b*-2 opposite to the first surfaces 442*a*-1 and 442*b*-1 of the first and second conductive members 442*a* and 442*b*. For example, at least one of the plurality of second pads 445 may be disposed on the outer periphery of the second surfaces 442*a*-2 and 442*b*-2 of the first and second conductive members 442*a* and 442*b*. For example, the plurality of second pads 445 may be disposed on the second surface 432 of the substrate 430.

According to an embodiment, the plurality of first pads 444 may be disposed on the outer periphery of the first surface 431 of the substrate 430 and the first surfaces 442*a*-1 and 442*b*-1 of the first and second conductive members 442*a* and 442*b* to connect the first surfaces 442*a*-1 and 442*b*-1 of the first and second conductive members 442*a* and 442*b* in multiple manners.

The plurality of second pads 445 may be disposed on the outer periphery of the second surface 432 of the substrate 430 and the second surfaces 442*a*-2 and 442*b*-2 of the first and second conductive members 442*a* and 442*b* to connect the second surfaces 442*a*-2 and 442*b*-2 of the first and second conductive members 442*a* and 442*b* in multiple manners.

For example, the plurality of first and second pads 444 and 445 may be disposed in a plurality of arrangement areas 420*a* formed on the first and second surfaces 431 and 432 of the substrate 430. For example, the plurality of first pads 444 may include a 1-1th pad 444*a* and a 1-2th pad 444*b* to be disposed on the outer periphery of the first surfaces 442*a*-1 and 442*b*-1 of the first and second conductive members 442*a* and 442*b*. The plurality of second pads 445 may include a 2-1th pad 445*a* and a 2-2th pad 445*b* to be disposed on the outer periphery of the second surfaces 442*a*-2 and 442*b*-2 of the first and second conductive members 442*a* and 442*b*.

The plurality of first pads 444 may be arranged in the plurality of arrangement areas 420*a* and on the first surfaces 442*a*-1 and 442*b*-1 of the first and second conductive members 442*a* and 442*b*, and the plurality of second pads 445 may be disposed in the plurality of arrangement areas 420*a* and on the second surfaces 442*a*-2 and 442*b*-2 of the first and second conductive members 442*a* and 442*b*.

For example, the 1-1th pad 444*a* may be disposed on the outer periphery of the first surface 442*a*-1 of the first conductive member 442*a*, and the 1-2th pad 444*b* may be disposed on the outer periphery of the first surface 442*b*-1 of the second conductive member 442*b*. The 2-1th pad 445*a* may be disposed on the outer periphery of the second surface 442*a*-2 of the first conductive member 442*a*, and the 2-2th pad 445*b* may be disposed on the outer periphery of the second surface 442*b*-2 of the second conductive member 442*b*.

For example, as the 1-1th pad 444*a*, the 1-2th pad 444*b*, the 2-1th pad 445*a*, and the 2-2nd pad 445*b* are disposed on the outer periphery of the first and second surfaces 442*a*-1, 442*b*-1, 442*a*-2, and 442*b*-2 of the first and second conductive members 442*a* and 442*b* and in the plurality of arrangement areas 420*a* of the substrate 430, the 1-1th pad 444*a*, the 1-2th pad 444*b*, the 2-1th pad 445*a*, and the 2-2nd pad 445*b* may prevent an electrical short circuit between the first and second surfaces 442*a*-1, 442*b*-1, 442*a*-2 and 442*b*-2 of the first and second conductive members 442*a* and 442*b* and the plurality of arrangement areas 420*a* of the substrate 430. For example, the plurality of first pads 444 including the 1-1th pad 444a and the 1-2th pad 444b and the plurality of second pads 445 including the 2-1th pad 445a and the 2-2th pad 445b may facilitate electrical connection between the first and second conductive members 442a and 442b and the first and second circuit boards 401 and 402.

According to various embodiments, the interposer 420 may be disposed between the first and second circuit boards 401 and 402, and the plurality of connecting structures 440 included in the interposer 420 may electrically signal-connect the first and second circuit boards 401 and 402 in the Z direction. For example, the plurality of connecting structures 440 may include first and second conductive members 442a and 442b for multiple electrical connections of the first and second circuit boards 401 and 402. The first and second surfaces 442a-1, 442b-1, 442a-2, and 442b-2 of the first and second conductive members 442a and 442b may electrically connect the first and second circuit boards 401 and 402 to each other in the +Z/−Z direction. For example, the first surfaces 442a-1 and 442b-1 of the first and second conductive members 442a and 442b may contact a first contact member (not shown) provided on the first circuit board 401 and may be electrically connected. The second surfaces 442a-2 and 442b-2, which are opposite to the first surfaces 442a-1 and 442b-1, of the first and second conductive members 442a and 442b may contact a second contact member (not shown) provided on the second circuit board 402 and may be electrically connected. Accordingly, the first and second conductive members 442a and 442b may be electrically connected with the first and second circuit boards 401 and 402 in multiple ways.

According to various embodiments, the shape of the first and second conductive members 442a and 442b may include at least one of a hemispherical shape, a donut shape, an elliptical shape, a rhombus shape, a quadrilateral shape (e.g., rectangular shape and/or a square shape), a hexagonal shape, or a polygonal shape. In an embodiment, as shown in FIG. 10, the shape of the first and second conductive members 442a and 442b may include a hemispherical shape. According to various embodiments, the material of the first and second conductive members 442a and 442b may include at least one of copper, gold, silver, magnesium, titanium, stainless steel, nickel, or aluminum. In the embodiment, the first and second conductive members 442a and 442b are described as formed of the disclosed materials as an example, but are not limited thereto. For example, the first and second conductive members 442a and 442b may be formed of any other various materials that may be electrically connected.

According to various embodiments, the insulating member 443 may include a filling member filling between the space between the first and second conductive members 442a and 442b, and the filling member may include at least one of silicon, rubber, latex, polyethylene terephthalate (PET), polyethylene (PE), Teflon, or thermoplastic polyurethane (TPU). The insulating member 443 may be any material that may fill the space between the first and second conductive members 442a and 442b.

According to various embodiments, the shape of the first and second pads 444 and 445 may include at least one of a hemispherical shape, a donut shape, an elliptical shape, a rhombus shape, a quadrilateral, a hexagonal shape, or a polygonal shape. In an embodiment, as shown in FIGS. 8 and 10, the shape of the plurality of first and second pads 444 and 445 may include a hemispherical shape. For example, in the embodiment, the shape of the plurality of first and second pads 444 and 445 is described as a hemispherical shape as an example. For example, the plurality of first and second pads 444 and 445 having a hemispherical shape may be disposed in the plurality of arrangement areas 420a formed on the first surface 431 of the substrate 430. The plurality of hemispherical first and second pads 444 and 445 may more easily arrange the plurality of arrangement areas 420a of the first and second surfaces 431 and 432 of the substrate 430 and the first and second conductive members 442a and 442b. Accordingly, the plurality of hemispherical first and second pads 444 and 445 may further prevent a short circuit between the first and second surfaces 442a-1, 442b-1, 442a-2, and 442b-2 of the first and second conductive members 442a and 442b and the first and second surfaces 431 and 432 of the substrate 430.

Figure 11:
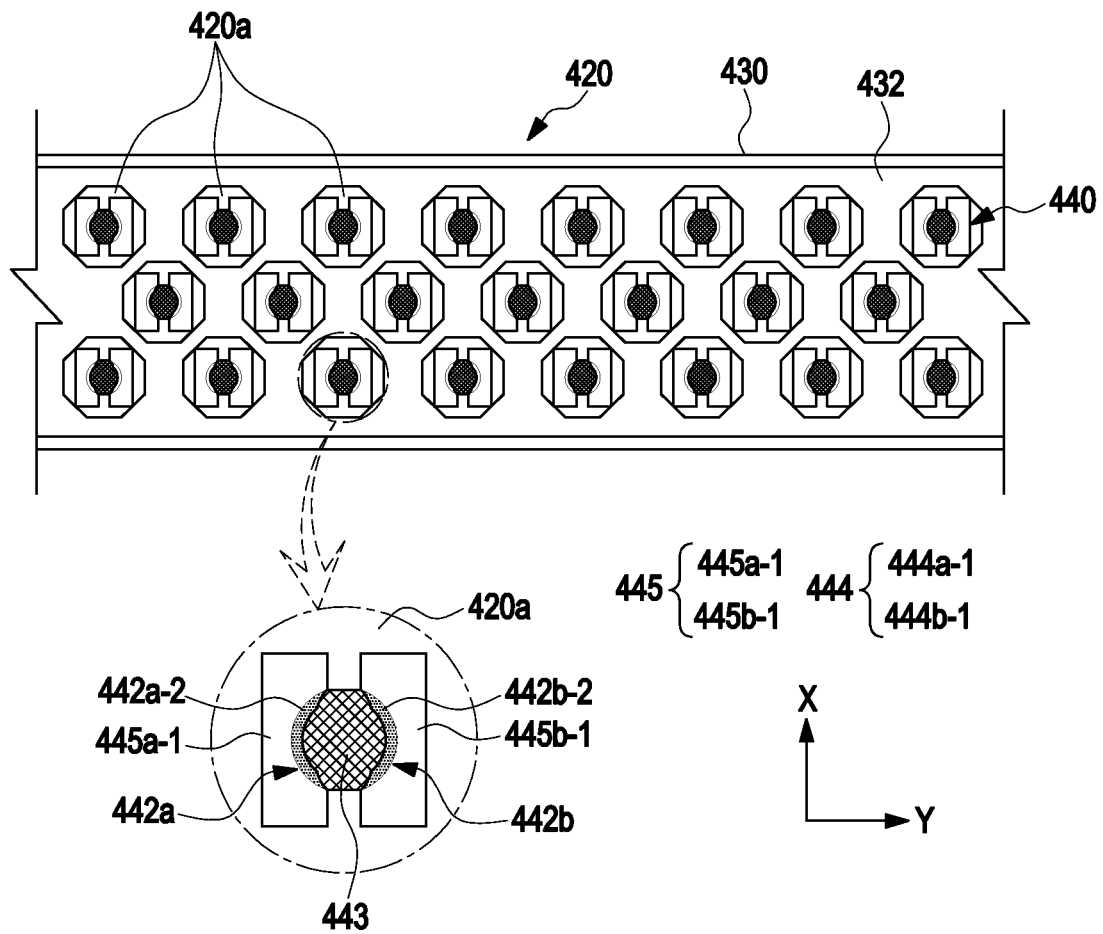
FIG. 11 is an enlarged plan view illustrating another embodiment of a plurality of connecting structures, according to an embodiment of the disclosure.

FIG. 11 is an enlarged plan view illustrating another embodiment of a plurality of connecting structures 440, according to an embodiment of the disclosure. Referring to FIGS. 8 and 11, the shape of the plurality of first and second pads 444 and 445 may include a rectangular shape. For example, by forming the plurality of first and second pads 444 and 445 in a rectangular shape, it is possible to further enhance the arrangement of the plurality of first and second pads 444 and 445 having the rectangular shape. For example, the first pads 444 may include a 1-1th pad 444a-1 corresponding to the first surface 442a-1 of the first conductive member 442a and a 1-2th pad 444b-1 corresponding to the first surface 442b-1 of the second conductive member 442b. Further, as shown in FIG. 11, the second pads 445 may include a 2-1th pad 445a-1 corresponding to the second surface 442a-2 of the first conductive member 442a and a 2-2th pad 445b-1 corresponding to the second surface 442b-2 of the second conductive member 442b. Further, the plurality of connecting structures 440 may include the first pads 444 in substantially the same shape as the second pads 445.

Figure 12:
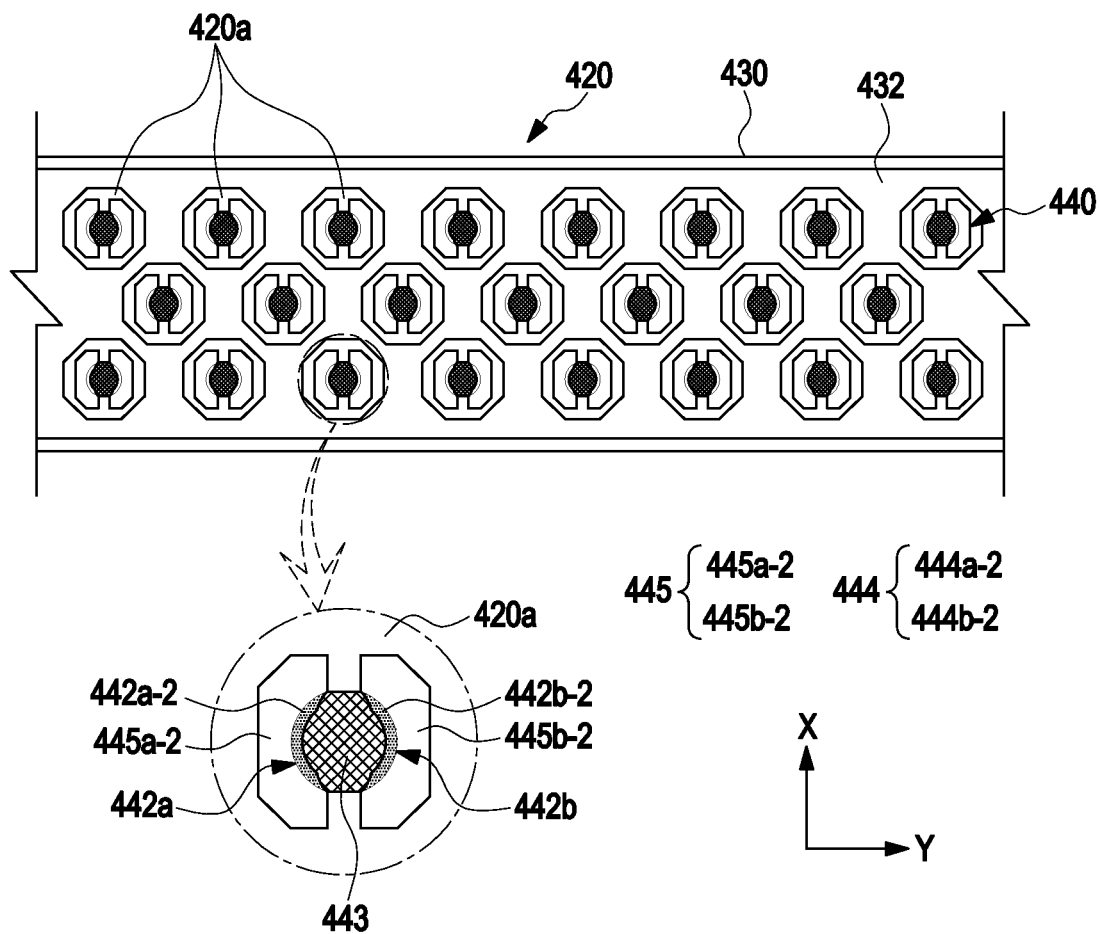
FIG. 12 is an enlarged plan view illustrating another embodiment of a plurality of connecting structures, according to an embodiment of the disclosure.

FIG. 12 is an enlarged plan view illustrating another embodiment of a plurality of connecting structures 440, according to an embodiment of the disclosure.

Referring to FIGS. 8 and 12, the shapes of the plurality of first and second pads 444 and 445 may include a polygonal shape (e.g., a hexagonal shape). For example, by forming the plurality of first and second pads 444 and 445 in a polygonal shape, it is possible to further enhance the arrangement of the plurality of first and second pads 444 and 445 having the polygonal shape. For example, the first pads 444 may include a 1-1th pad 444a-2 corresponding to the first surface 442a-1 of the first conductive member 442a and a 1-2th pad 444b-2 corresponding to the first surface 442b-1 of the second conductive member 442b. Further, as shown in FIG. 12, the second pads 445 may include a 2-1th pad 445a-2 corresponding to the second surface 442a-2 of the first conductive member 442a and a 2-2th pad 445b-2 corresponding to the second surface 442b-2 of the second conductive member 442b. Further, the plurality of connecting structures 440 may include the first pads 444 in substantially the same shape as the second pads 445.

According to various embodiments, at least one of the plurality of connecting structures 440 may be disposed on the outer periphery of the substrate 430 and may form a ground (not shown). For example, as at least one of the plurality of connecting structures 440 in which the ground is formed are disposed on the outermost periphery of the substrate 430, it is possible to shield the electromagnetic waves or noise generated from the electronic components (not shown) arranged outside the substrate 430. For example, at least one of the plurality of connecting structures 440 in which the ground is formed may serve as a shield can. Accordingly, at least one of the plurality of connecting structures 440 including the ground may shield the electromagnetic waves or noise from the electronic components disposed outside the interposer 420. At least one of the remaining plurality of connecting structures 440, where the ground is not formed, may electrically connect the first and second circuit boards 401 and 402. Accordingly, the plurality of connecting structures 440 having such a structure may further enhance the function of the interposer 420.

According to an embodiment, the first pad 444 and/or the second pad 445 are not limited to the illustrated example and may be formed in various shapes. For example, the second pad 445 may have an asymmetric shape. For example, the 2-1th pad 445a corresponding to the second surface 442a-2 of the first conductive member 442a may be formed in a hemispherical shape (e.g., refer to FIG. 10), and the 2-2th pad 445b may be formed in a rectangular shape (e.g., refer to FIG. 11). According to another embodiment, the 2-1th pad 445a corresponding to the second surface 442a-2 of the first conductive member 442a may be formed in a rectangular shape (e.g., refer to FIG. 11), and the 2-2th pad 445b may be formed in a hemispherical shape (e.g., refer to FIG. 10).

According to an embodiment, the first pad 444 and the second pad 445 may be formed in different shapes. For example, it may be formed in different shapes based on the circuit boards (e.g., the first circuit board 401 and the second circuit board 402) electrically connected with the interposer 420. For example, the first pad 444 may be formed as a hemispherical pad (e.g., refer to FIG. 10), and the second pad 445 may be formed in a polygonal shape (e.g., refer to FIG. 12). According to another embodiment, the second pad 445 may be formed as a hemispherical pad (e.g., refer to FIG. 10), and the first pad 444 may be formed in a polygonal shape (e.g., refer to FIG. 12).

Figure 13A:
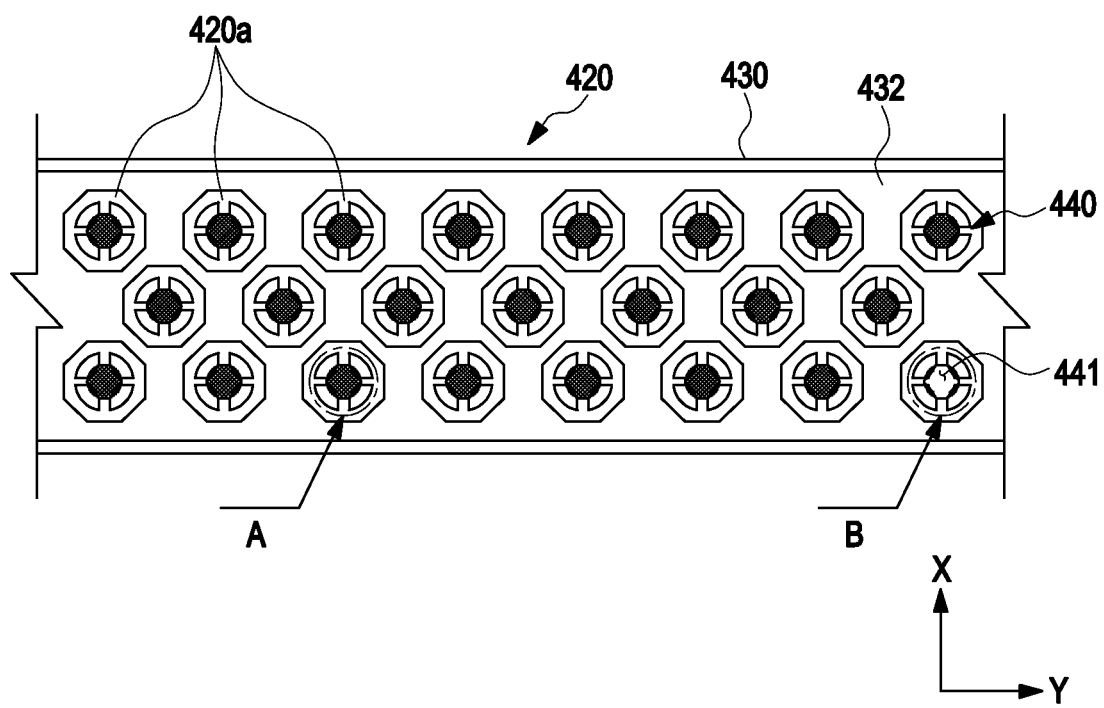
FIG. 13A is an enlarged plan view illustrating another embodiment of a plurality of connecting structures, according to an embodiment of the disclosure.
Figure 13B:
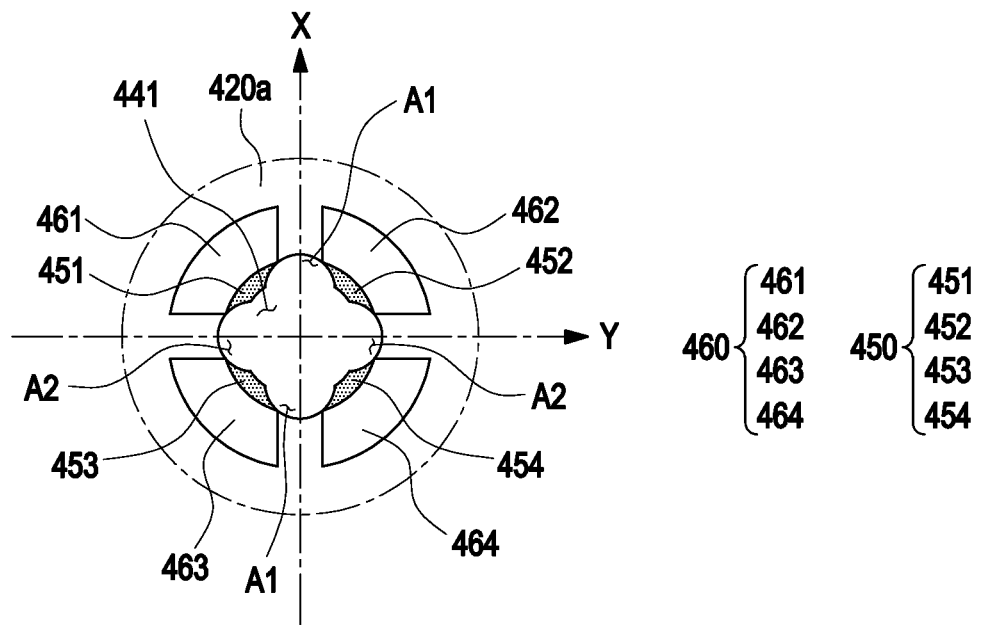
FIG. 13B is an enlarged plan view of a portion A of FIG. 13A, illustrating a state before an insulating member fills a plurality of via holes formed in a substrate according to an embodiment of the disclosure.
Figure 13C:
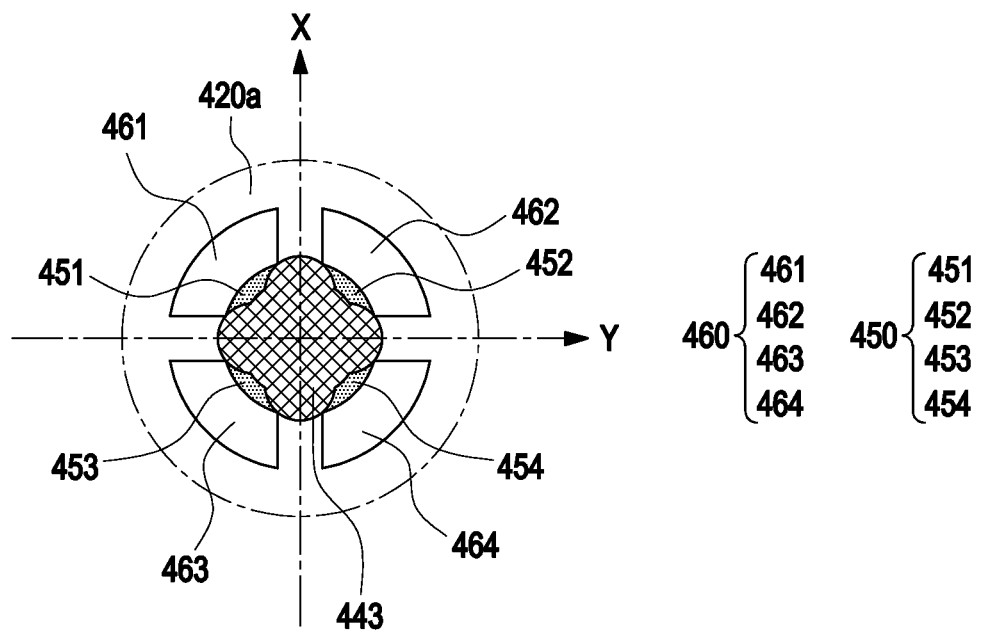
FIG. 13C is an enlarged plan view of a portion B of FIG. 13A, illustrating a state in which an insulating member fills a plurality of via holes formed in a substrate according to an embodiment of the disclosure.

FIG. 13A is an enlarged plan view illustrating another embodiment of a plurality of connecting structures 440, according to an embodiment of the disclosure. FIG. 13B is an enlarged plan view of a portion A of FIG. 13A, illustrating a state before an insulating member fills a plurality of via holes formed in a substrate according to an embodiment of the disclosure. FIG. 13C is an enlarged plan view of a portion B of FIG. 13A, illustrating a state in which an insulating member fills a plurality of via holes formed in a substrate according to an embodiment of the disclosure.

Referring to FIGS. 13A to 13C, according to various embodiments, the plurality of connecting structures 440 may include a plurality of via holes 441, a plurality of conductive members 450, an insulating member 443, and a plurality of pads 460. For example, a plurality of arrangement areas 420a may be formed on the substrate 430 of the interposer 420 to arrange the plurality of connecting structures 440. The plurality of via holes 441 may be formed in the plurality of arrangement areas 420a.

According to an embodiment, the conductive member 450 may be plated on the inside of the plurality of via holes 441. The conductive member 450 may be formed in a ring shape. For example, the conductive member 450 may be formed in a ring shape along the inner periphery of the plurality of via holes 441. In this state, at least a portion of the conductive member 450 may be cut by a drilling tool (not shown) while at least one first hole A1 may simultaneously be formed. For example, the at least one first hole A1 may be formed in the upper or lower side of the conductive member 450 using the drilling tool. For example, the at least one first hole A1 may be formed in the upper side or lower side in the Y-axis direction. For example, the drilling tool may move up and down along the Z direction, forming at least one first hole A1 in the upper and lower sides of the conductive member 442.

Further, at least one second hole A2 may be formed in the left or right side of the conductive member 450 using the drilling tool. For example, the at least one second hole A2 may be formed in the left or right side with respect to the X-axis direction. For example, the drilling tool may move up and down along the Z direction, forming at least one second hole A2 in the left and right sides of the conductive member 442. In this case, the conductive member 450 may be separated by the at least one first and second hole A1 and A2. For example, the conductive member 450 may be separated into first, second, third, and fourth conductive members 451, 452, 453 and 454 by the first and second holes A1 and A2. Accordingly, the conductive member 450 may be formed with the at least one first and second hole A1 and A2 in the left or right side of the X-axis direction or in the upper side and the lower side of the Y-axis direction using the drilling tool, and the first, second, third and fourth conductive members 451, 452, 453, and 454 may be separated and disposed by the at least one first and second hole A1 and A2.

In an embodiment, the insulating member 443 may fill a space formed between the first, second, third, and fourth conductive members 451, 452, 453, and 454. The insulating member 443 may fill the space between the first, second, third, and fourth conductive members 451, 452, 453, and 454, electrically insulating the first, second, third and fourth conductive members 451, 452, 453, and 454. Accordingly, each of the first, second, third, and fourth conductive members 451, 452, 453, and 454 may independently make an electrical connection by the insulating member 443.

According to various embodiments, the plurality of pads 460 may include first, second, third, and fourth pads 461, 462, 463, and 464 and fifth, sixth, seventh, and eighth pads (not shown). For example, the first, second, third, and fourth pads 461, 462, 463, and 464 may be disposed on the outer periphery of the first, second, third, and fourth conductive members 451, 452, 453 and 454. For example, a first pad 461 may be disposed on the outer periphery of the first surface of the first conductive member 451, a second pad 462 may be disposed on the outer periphery of the first surface of the second conductive member 452, a third pad 463 may be disposed on the outer periphery of the first surface of the third conductive member 453, and a fourth pad 464 may be disposed on the outer periphery of the first surface of the fourth conductive member 454.

According to an embodiment, the first, second, third, and fourth pads 461, 462, 463, and 464 may be disposed on the second surface 432 of the substrate 430. For example, the first, second, third, and fourth pads 461, 462, 463, and 464 may be disposed in a plurality of arrangement areas 420a formed on the second surface 432 of the substrate 430.

According to an embodiment, the fifth, sixth, seventh, and eighth pads (not shown) may be disposed in a plurality of arrangement areas (not shown) formed on the first surface (not shown) of the substrate 430. For example, fifth, sixth, seventh, and eighth pads (not shown) may be disposed on the outer periphery of the second surface (not shown) opposite to the first surface of the first, second, third, and fourth conductive members 451, 452, 453 and 454. For example, a fifth pad may be disposed on the periphery of the second surface of the first conductive member 451, a sixth pad may be disposed on the periphery of the second surface of the second conductive member 452, a seventh pad may be disposed on the periphery of the second surface of the third conductive member 453, and an eighth pad may be disposed on the outer periphery of the second surface of the fourth conductive member 454.

Accordingly, the first, second, third, and fourth pads 461, 462, 463, and 464 and the fifth, sixth, seventh, and eighth pads may be disposed on the outer periphery of the first and second surfaces of the first, second, third, and fourth conductive members 451, 452, 453, and 454 and the first and second surfaces 431 and 432 of the substrate 430 for multiple electrical connections between the first and second surfaces of the first, second, third, and fourth conductive members 451, 452, 453, and 454 and the first and second circuit boards 401 and 402.

For example, as the first, second, third, and fourth pads 461, 462, 463, and 464 and the fifth, sixth, seventh, and eighth pads (not shown) are disposed in the plurality of arrangement areas 420a formed on the first and second surfaces 431 and 432 of the substrate 430 and on the outer periphery of the first and second surfaces of the first, second, third, and fourth conductive members 451, 452, 453, and 454, the first, second, third, and fourth pads 461, 462, 463, and 464 and the fifth, sixth, seventh, and eighth pads may prevent an electrical short circuit between the first and second surfaces of the first, second, third, and fourth conductive members 451, 452, 453, and 454 and the plurality of arrangement areas 420a formed on the first and second surfaces 431 and 432 of the substrate 430. Accordingly, the first, second, third, and fourth pads 461, 462, 463, and 464 and the fifth, sixth, seventh, and eighth pads may facilitate electrical connection between the first and second conductive members 442a and 442b and the first and second circuit boards 401 and 402.

For example, the first and second surfaces of the first, second, third, and fourth conductive members 451, 452, 453, and 454 may be electrically connected in the Z direction (e.g., the Z direction of FIG. 6). For example, the first surfaces of the first, second, third, and fourth conductive members 451, 452, 453, and 454 may contact a first contact member (not shown) provided on the first circuit board 401 and may be electrically connected, and the second surfaces (not shown) opposite to the first surface of the first, second, third, and fourth conductive members 451, 452, 453, and 454 may contact a second contact member (not shown) provided on the second circuit board 402 and may be electrically connected. As such, as the first, second, third, and fourth pads 461, 462, 463, and 464 and the fifth, sixth, seventh, and eighth pads prevent an electrical short circuit between the first and second surfaces of the first, second, third, and fourth conductive members 451, 452, 453, and 454 and the plurality of arrangement areas 420a formed on the first and second surfaces 431 and 432 of the substrate 430, it is possible to facilitate electrical connection between the first, second, third, and fourth conductive members 451, 452, 453, and 454 and the first and second circuit boards 401 and 402.

Figure 14:
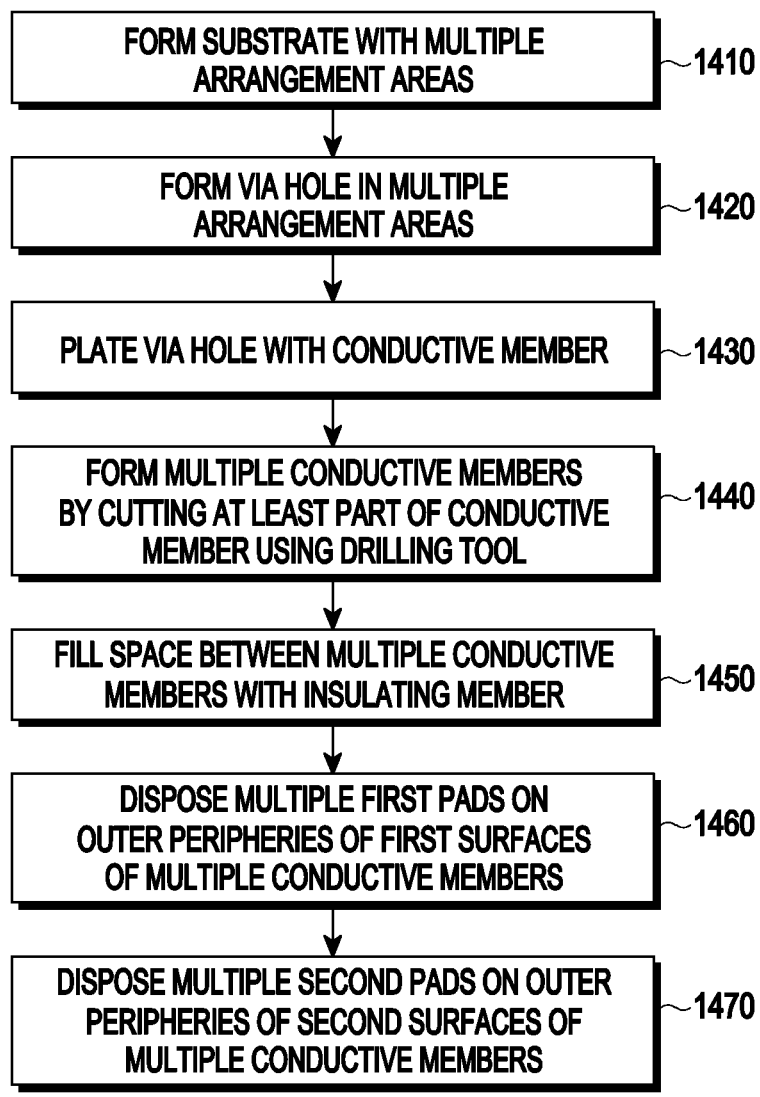
FIG. 14 is a flowchart illustrating a method for manufacturing a plurality of connecting structures according to an embodiment of the disclosure.

FIG. 14 is a flowchart illustrating a method for manufacturing a plurality of connecting structures 440 according to an embodiment of the disclosure.

Referring to FIG. 14, a method for manufacturing an interposer 420 is described as follows. For example, a substrate 430 overall having a single closed loop shape may be prepared.

In an embodiment, a plurality of arrangement areas 420a may be formed on the substrate 430 to arrange a plurality of connecting structures 440 (1410). As shown in (a) of FIGS. 8 and 9, via holes 441 may be formed in the plurality of arrangement areas 420a (1420).

According to an embodiment, the conductive member 442 may be plated on the inside of the via hole 441 (1430). The conductive member 442 may be formed in a ring shape. For example, as shown in (b) of FIGS. 8 and 9, the conductive member 442 may be formed in a ring shape along the inner periphery of the via hole 441.

According to an embodiment, as shown in (c) of FIGS. 8 and 9, at least a portion of the conductive member 442 may be cut by a drilling tool (not shown), forming at least one hole A1 (1440).

For example, at least one hole A1 may be formed in the upper and lower sides of the conductive member 442 along the X-direction using the drilling tool. For example, the drilling tool may move up and down along the Z direction, forming the at least one hole A1 in the upper and lower sides of the conductive member 442. In this case, the conductive member 442 may be separated by the hole A1. Thus, the conductive member 442 may be separated into first and second conductive members 442a and 442b.

The first and second conductive members 442a and 442b may include at least one of a hemispherical shape, a donut shape, an elliptical shape, a rhombus shape, a quadrilateral shape, a hexagonal shape, or a polygonal shape. In an embodiment, the shape of the first and second conductive members 442a and 442b of the plurality of conductive members 442 may include a hemispherical shape. According to various embodiments, the material of the first and second conductive members 442a and 442b may include at least one of copper, gold, silver, magnesium, titanium, stainless steel, nickel, or aluminum. For example, the first and second conductive members 442a and 442b may be formed of other various materials that may make an electrical connection.

According to an embodiment, an insulating member 443 may fill a space formed between the first and second conductive members 442a and 442b as shown in (d) of FIGS. 8 and 9 (1450).

According to an embodiment, the insulating member 443 may include a filling member, and the filling member may include at least one of silicon, rubber, latex, polyethylene terephthalate (PET), polyethylene (PE), Teflon, or thermoplastic polyurethane (TPU). The insulating member 443 may be any material that may insulate the first and second conductive members 442a and 442b from each other.

According to an embodiment, as shown in (e) of FIGS. 8 and 9, the insulating member 443 may fill the space between the first and second conductive members 442a and 442b and may electrically insulate the first and second conductive members 442a and 442b. For example, the insulating member 443 may separate the first and second conductive members 442a and 442b. The insulating member 443 may electrically insulate the first and second conductive members 442a and 442b so that the first and second conductive members 442a and 442b and the first and second circuit boards 401 and 402 may be electrically connected in multiple ways.

According to an embodiment, as shown in (f) of FIGS. 8 and 9, a plurality of first pads 444 may be disposed on the outer periphery of the first and second conductive members 442a and 442b (1460). For example, at least one of the plurality of first pads 444 may be disposed on the outer periphery of the first surfaces 442a-1 and 442b-1 of the first and second conductive members 442a and 442b, and at least one of the plurality of second pads 445 may be disposed on the outer periphery of the second surfaces 442a-2 and 442b-2 opposite to the first surfaces 442a-1 and 442b-1 of the first and second conductive members 442a and 442b.

For example, the plurality of first pads 444 may be disposed on the first surface 431 of the substrate 430, and the plurality of second pads 445 may be disposed on the second surface 432 opposite to the first surface 431 of the substrate 430. For example, at least one of the plurality of second pads 445 may be disposed on the outer periphery of the second surfaces 442a-2 and 442b-2 opposite to the first surfaces 442a-1 and 442b-1 of the first and second conductive members 442a and 442b (1470).

For example, at least one of the plurality of second pads 445 may be disposed on the outer periphery of the second surfaces 442a-2 and 442b-2 of the first and second conductive members 442a and 442b.

Accordingly, the plurality of first and second pads 444 and 445 may be disposed on the outer periphery of the first and second surfaces 442a-1, 442b-1, 442a-2, and 442b-2 of the first and second conductive members 442a and 442b. For example, the plurality of first and second pads 444 and 445 may be disposed on the first and second surfaces 442a-1, 442b-1, 442a-2, and 442b-2 of the first and second conductive members 442a and 442b and the plurality of arrangement areas 420a formed on the first and second surfaces 431 and 432 of the substrate 430. For example, as the plurality of first and second pads 444 and 445 are disposed in the plurality of arrangement areas 420a formed on the first and second surfaces 431 and 432 of the substrate 430 and on the outer periphery of the first and second surfaces 442a-1, 442b-1, 442a-2, and 442b-2 of the first and second conductive members 442a and 442b, the plurality of first and second pads 444 and 445 may prevent an electrical short circuit between the first and second surfaces 442a-1, 442b-1, 442a-2, and 442b-2 of the first and second conductive members 442a and 442b and the plurality of arrangement areas 420a of the substrate 430.

For example, the first surfaces 442a-1 and 442b-1 and the second surfaces 442a-2 and 442b-2 of the first and second conductive members 442a and 442b may be electrically connected with the first and second circuit boards 401 and 402. For example, the first surfaces 442a-1 and 442b-1 of the first and second conductive members 442a and 442b may contact a first contact member (not shown) provided on the first circuit board 401 and may be electrically connected. The second surfaces 442a-2 and 442b-2, which are opposite to the first surfaces 442a-1 and 442b-1, of the first and second conductive members 442a and 442b may contact a second contact member (not shown) provided on the second circuit board 402 and may be electrically connected. For example, the interposer 420 may be disposed between the first and second circuit boards 401 and 402. The plurality of connecting structures 440 may be disposed on the interposer 420. The first and second surfaces 442a-1, 442b-1, 442a-2, and 442b-2 of the first and second conductive members 442a and 442b disposed on the plurality of connecting structures 440 may contact the first and second contact members (not shown) provided on the first and second circuit boards 401 and 402 and be electrically connected.

According to various embodiments, at least one of the plurality of connecting structures 440 may be disposed on the outer periphery of the substrate 430 and may form a ground. For example, at least one of the plurality of connecting structures 440 disposed on the outermost periphery of the substrate 430 forms a ground, thus shielding the electromagnetic waves or noise generated from electronic components (not shown) disposed outside the substrate 430. For example, at least one of the plurality of connecting structures 440 in which the ground is formed may serve as a shield can. According to an embodiment, at least one of the remaining plurality of connecting structures 440, where the ground is not formed, may be disposed inside the substrate 430 and may electrically connect the first and second circuit boards 401 and 402. Accordingly, the plurality of connecting structures 440 having such a structure may further enhance the function of the interposer 420.

According to various embodiments of the disclosure, an interposer (e.g., interposer 420 of FIG. 5) may comprise a substrate (e.g., interposer 420 of FIG. 7) including a first surface facing in a first direction and a second surface facing in a second direction opposite to the first direction, and a plurality of connecting structures (e.g., connecting structures 440 of FIG. 7) disposed on the substrate and electrically connecting a first circuit board and a second circuit board (e.g., first and second circuit boards 401 and 402 of FIG. 5) disposed in an electronic device (e.g., electronic device 400 of FIG. 5). The plurality of connecting structures may include a plurality of via holes (e.g., via holes 441 of FIG. 8) formed in the substrate, a plurality of conductive members (e.g., conductive members 442a and 442b of FIG. 8) disposed in the plurality of via holes, an insulating member (e.g., insulating member 443 of FIG. 8) disposed between the plurality of conductive members, and a plurality of first pads (e.g., plurality of first pads 444 of FIG. 8) disposed on the first surface of the substrate and disposed on an outer periphery of a first surface of the plurality of conductive members, and a plurality of second pads (e.g., plurality of second pads 445 of FIG. 8) disposed on the second surface of the substrate and disposed on an outer periphery of a second surface, opposite to the first surface, of the plurality of conductive members. The plurality of conductive members may be separately disposed on the first and second surfaces of the substrate for electrical connection with the first and second circuit boards. The plurality of first and second pads may be disposed on the first and second surfaces of the substrate and on the outer peripheries of the first and second surfaces of the plurality of conductive members.

According to various embodiments of the disclosure, the substrate may include a substrate having a closed loop shape.

According to various embodiments of the disclosure, shapes of the plurality of conductive members may include at least one of a hemispherical shape, a donut shape, an elliptical shape, a rhombus shape, a quadrilateral shape, a hexagonal shape, or a polygonal shape.

According to various embodiments of the disclosure, materials of the plurality of conductive members may include at least one of copper, gold, silver, magnesium, titanium, stainless steel, nickel, or aluminum.

According to various embodiments, the insulating member may include a filling member. The filling member may include at least one of silicone, rubber, latex, polyethylene terephthalate (PET), polyethylene (PE), Teflon, or thermoplastic polyurethane (TPU).

According to various embodiments, shapes of the plurality of first and second pads may include at least one of a hemispherical shape, a donut shape, an elliptical shape, a rhombus shape, a quadrilateral shape, a hexagonal shape, or a polygonal shape.

According to various embodiments, a plurality of first and second components may be disposed on the first and second circuit boards. The plurality of first and second components may include at least one of a microphone, a speaker, a memory card, a processor, a plurality of sensors, an antenna, a plurality of connectors, an inductor, an active element, a passive element, or a circuit element.

According to various embodiments, at least one of the plurality of connecting structures may include a ground. At least one of the plurality of connecting structures including the ground may be disposed on an outer periphery of the substrate.

According to various embodiments of the disclosure, a method for manufacturing an interposer may comprise forming a substrate including a first surface facing in a first direction and a second surface facing in a second direction opposite to the first direction, forming a plurality of via holes in the substrate, plating the plurality of via holes with a conductive member, forming a plurality of conductive members while cutting at least a portion of the conductive member using a drilling tool and separately disposing the plurality of conductive members, filling a space between the plurality of conductive members with an insulating member, disposing a plurality of first pads on the first surface of the substrate and on an outer periphery of a first surface of the plurality of conductive members, and disposing a plurality of second pads on the second surface of the substrate and on an outer periphery of a second surface, opposite to the first surface, of the plurality of conductive members.

According to various embodiments of the disclosure, an electronic device may comprise a housing, a first circuit board disposed in the housing, a second circuit board spaced apart from the first circuit board, and an interposer disposed between the first and second circuit boards. The interposer may include a substrate including a first surface facing in a first direction and a second surface facing in a second direction opposite to the first direction, and a plurality of connecting structures disposed on the substrate, the plurality of connecting structures electrically connecting a first circuit board and a second circuit board disposed in an electronic device. The plurality of connecting structures may include a plurality of via holes formed in the substrate, a plurality of conductive members disposed in the plurality of via holes, an insulating member disposed between the plurality of conductive members, a plurality of first pads disposed on the first surface of the substrate and disposed on an outer periphery of a first surface of the plurality of conductive members, and a plurality of second pads disposed on the second surface of the substrate and disposed on an outer periphery of a second surface, opposite to the first surface, of the plurality of conductive members. The plurality of conductive members may be separately disposed on the first and second surfaces of the substrate for electrical connection with the first and second circuit boards. The plurality of first and second pads may be disposed on the first and second surfaces of the substrate and on the outer peripheries of the first and second surfaces of the plurality of conductive members.

According to various embodiments of the disclosure, an interposer may comprise a substrate and a plurality of connecting structures disposed on the substrate and electrically connecting a first circuit board and a second circuit board disposed in the electronic device. The plurality of connecting structures may include a plurality of via holes formed in the substrate, a plurality of conductive members disposed in the plurality of via holes, an insulating member disposed between the plurality of conductive members, and a plurality of pads disposed on the outer periphery of the plurality of conductive members. The plurality of conductive members may be separately disposed on the substrate to electrically connect with the first and second circuit boards.

It is apparent to one of ordinary skill in the art that the electronic device including an interposer according to various embodiments of the disclosure as described above are not limited to the above-described embodiments and those shown in the drawings, and various changes, modifications, or alterations may be made thereto without departing from the scope of the disclosure.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:
1. An interposer, comprising:
a substrate including a first surface facing in a first direction and a second surface facing in a second direction opposite to the first direction; and
a plurality of connecting structures disposed on the substrate, the plurality of connecting structures electrically connecting a first circuit board and a second circuit board disposed in an electronic device,
wherein the plurality of connecting structures include:
a plurality of via holes formed in the substrate,
a plurality of conductive members disposed in the plurality of via holes,
an insulating member disposed between the plurality of conductive members,
a plurality of first pads disposed on the first surface of the substrate and disposed on an outer periphery of a first surface of the plurality of conductive members, and
a plurality of second pads disposed on the second surface of the substrate and disposed on an outer periphery of a second surface, opposite to the first surface, of the plurality of conductive members,
wherein the plurality of conductive members are separately disposed on the first and second surfaces of the substrate for electrical connection with the first and second circuit boards, and
wherein the plurality of first and second pads are disposed on the first and second surfaces of the substrate and on the outer peripheries of the first and second surfaces of the plurality of conductive members.

2. The interposer of claim 1, wherein the substrate includes a substrate having a closed loop shape.

3. The interposer of claim 1, wherein a shape of the plurality of conductive members includes at least one of a hemispherical shape, a donut shape, an elliptical shape, a rhombus shape, a quadrilateral shape, a hexagonal shape, or a polygonal shape.

4. The interposer of claim 1, wherein a material of the plurality of conductive members includes at least one of copper, gold, silver, magnesium, titanium, stainless steel, nickel, or aluminum.

5. The interposer of claim 1,
wherein the insulating member includes a filling member, and
wherein the filling member includes at least one of silicone, rubber, latex, polyethylene terephthalate (PET), polyethylene (PE), Teflon, or thermoplastic polyurethane (TPU).

6. The interposer of claim 1, wherein a shape of the plurality of first and second pads includes at least one of a hemispherical shape, a donut shape, an elliptical shape, a rhombus shape, a quadrilateral shape, a hexagonal shape, or a polygonal shape.

7. The interposer of claim 1,
wherein a plurality of first and second components are disposed on the first and second circuit boards, and wherein the plurality of first and second components include at least one of a microphone, a speaker, a memory card, a processor, a plurality of sensors, an antenna, a plurality of connectors, an inductor, an active element, a passive element, or a circuit element.

8. The interposer of claim 1,
wherein at least one of the plurality of connecting structures include a ground, and
wherein at least one of the plurality of connecting structures including the ground are disposed on an outer periphery of the substrate.

9. The interposer of claim 1, wherein each of the plurality of connecting structures includes two conductive members disposed in a single via hole.

10. The interposer of claim 1, wherein at least one of the plurality of connecting structures is disposed adjacent to a non-conducting portion of the substrate.

11. A method for manufacturing an interposer, the method comprising:
forming a plurality of via holes in a substrate including a first surface facing in a first direction and a second surface facing in a second direction opposite to the first direction;
plating the plurality of via holes with a conductive member;
cutting at least a portion of the conductive member using a drilling tool to form a plurality of conductive members such that the plurality of conductive members are separately disposed;
filling a space between the plurality of conductive members with an insulating member;
disposing a plurality of first pads on the first surface of the substrate and on an outer periphery of a first surface of the plurality of conductive members; and
disposing a plurality of second pads on the second surface of the substrate and on an outer periphery of a second surface, opposite to the first surface, of the plurality of conductive members.

12. The method of claim 11, wherein the cutting of at least the portion of the conductive member using the drilling tool comprises:
drilling a first hole at a first portion of the conductive member, and
drilling a second hole at a second portion, different from the first portion, of the conductive member.

13. An electronic device, comprising,
a housing;
a first circuit board disposed in the housing;
a second circuit board spaced apart from the first circuit board; and
an interposer disposed between the first and second circuit boards,
wherein the interposer includes:
a substrate including a first surface facing in a first direction and a second surface facing in a second direction opposite to the first direction, and
a plurality of connecting structures disposed on the substrate and electrically connecting a first circuit board and a second circuit board disposed in the electronic device,
wherein the plurality of connecting structures include:
a plurality of via holes formed in the substrate,
a plurality of conductive members disposed in the plurality of via holes,
an insulating member disposed between the plurality of conductive members,
a plurality of first pads disposed on the first surface of the substrate and disposed on an outer periphery of a first surface of the plurality of conductive members, and
a plurality of second pads disposed on the second surface of the substrate and disposed on an outer periphery of a second surface, opposite to the first surface, of the plurality of conductive members,
wherein the plurality of conductive members are separately disposed on the first and second surfaces of the substrate for electrical connection with the first and second circuit boards, and
wherein the plurality of first and second pads are disposed on the first and second surfaces of the substrate and on the outer peripheries of the first and second surfaces of the plurality of conductive members.

14. The electronic device of claim 13, wherein a shape of the plurality of conductive members includes at least one of a hemispherical shape, a donut shape, an elliptical shape, a rhombus shape, a quadrilateral shape, a hexagonal shape, or a polygonal shape.

15. The electronic device of claim 13, wherein a shape of the plurality of first and second pads includes at least one of a hemispherical shape, a donut shape, an elliptical shape, a rhombus shape, a quadrilateral shape, a hexagonal shape, or a polygonal shape.

16. The electronic device of claim 13,
wherein the insulating member includes a filling member, and
wherein the filling member includes at least one of silicone, rubber, latex, polyethylene terephthalate (PET), polyethylene (PE), Teflon, or thermoplastic polyurethane (TPU).

17. The electronic device of claim 13,
wherein at least one of the plurality of connecting structures include a ground, and
wherein at least one of the plurality of connecting structures including the ground are disposed on an outer periphery of the substrate.

18. The electronic device of claim 13,
wherein a plurality of first and second components are disposed on the first and second circuit boards, and
wherein the plurality of first and second components include at least one of a microphone, a speaker, a memory card, a processor, a plurality of sensors, an antenna, a plurality of connectors, an inductor, an active element, a passive element, or a circuit element.

* * * * *